United States Patent
Kashiyama et al.

(10) Patent No.: US 9,465,293 B2
(45) Date of Patent: Oct. 11, 2016

(54) SUBSTRATE PROCESSING APPARATUS AND SUBSTRATE PROCESSING METHOD

(71) Applicants: Masahito Kashiyama, Kyoto (JP); Koji Nishiyama, Kyoto (JP)

(72) Inventors: Masahito Kashiyama, Kyoto (JP); Koji Nishiyama, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 10 days.

(21) Appl. No.: 13/965,501

(22) Filed: Aug. 13, 2013

(65) Prior Publication Data

US 2014/0065309 A1    Mar. 6, 2014

(30) Foreign Application Priority Data

Aug. 29, 2012 (JP) .................................. 2012-188492

(51) Int. Cl.
*H01L 21/67* (2006.01)
*G03F 7/16* (2006.01)
*H01L 21/683* (2006.01)

(52) U.S. Cl.
CPC .......... *G03F 7/16* (2013.01); *H01L 21/67028* (2013.01); *H01L 21/67046* (2013.01); *H01L 21/6838* (2013.01)

(58) Field of Classification Search
CPC .......... H01L 21/6838; H01L 21/6875; H01L 21/68771; H01L 21/67017–21/6704; H01L 21/67051
See application file for complete search history.

(56) References Cited

U.S. PATENT DOCUMENTS

| | | | |
|---|---|---|---|
| 4,559,718 A * | 12/1985 | Tadokoro | 34/317 |
| 5,553,994 A | 9/1996 | Biche et al. | 414/752 |
| 5,935,768 A | 8/1999 | Biche et al. | 430/401 |
| 6,050,885 A * | 4/2000 | Morsch et al. | 451/287 |
| 2003/0213431 A1 | 11/2003 | Fukutomi et al. | 118/696 |
| 2008/0163899 A1 | 7/2008 | Takiguchi et al. | 134/30 |

(Continued)

FOREIGN PATENT DOCUMENTS

| | | |
|---|---|---|
| JP | 07-161632 A | 6/1995 |
| JP | 2003-324139 | 11/2003 |
| JP | 2008-177541 A | 7/2008 |
| JP | 2010-182913 A | 8/2010 |

(Continued)

OTHER PUBLICATIONS

Notice of Reasons for Refusal dated Jun. 7, 2016 in corresponding Patent Application No. JP 2012-188492.

*Primary Examiner* — Dah-Wei D Yuan
*Assistant Examiner* — Stephen Kitt
(74) *Attorney, Agent, or Firm* — Ostrolenk Faber LLP

(57) ABSTRACT

Transport mechanisms are respectively provided in first and second processing blocks. Each transport mechanism has a hand. The hand holds the other surface of a substrate without coming into contact with an edge of the substrate. The hand is moved such that the substrate is transported between an adhesion reinforcement processing unit or a cooling unit and a coating processing unit or a development processing unit. In the adhesion reinforcement processing unit and the cooling unit, temperature processing is performed on the substrate while the back surface of the substrate is held by suction. In the coating processing unit and the development processing unit, a processing liquid is supplied to the main surface of the substrate while the back surface of the substrate is held by suction by a spin chuck.

9 Claims, 26 Drawing Sheets

(56) References Cited

U.S. PATENT DOCUMENTS

2011/0063588 A1* 3/2011 Kashiyama et al. ............ 355/27
2012/0135148 A1  5/2012 Deguchi et al. ........... 427/372.2
2014/0102474 A1  4/2014 Takiguchi et al. ............. 134/1.3

FOREIGN PATENT DOCUMENTS

| JP | 2011-003601 A | 1/2011 |
| JP | 2012-119370 A | 6/2012 |
| WO | WO 99/49504 | 9/1999 |

* cited by examiner

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for performing predetermined processing on a substrate.

2. Description of Related Art

A substrate processing apparatus is used to apply a variety of processing to substrates such as semiconductor substrates, substrates for use in liquid crystal displays, plasma displays, optical discs, magnetic discs, magneto-optical discs, photomasks, and other substrates.

Such a substrate processing apparatus generally subjects a single substrate to a plurality of different types of processing successively. The substrate processing apparatus as described in JP 2003-324139 A is constituted by an indexer block, an anti-reflection film processing block, a resist film processing block, a development processing block, and an interface block. An exposure device that is an external device separated from the substrate processing apparatus is arranged to be adjacent to the interface block.

In the above-mentioned substrate processing apparatus, a substrate carried in from the indexer block is subjected to anti-reflection film formation and resist film coating processing by the anti-reflection film processing block and the resist film processing block. Thereafter, the substrate is transported to the exposure device via the interface block. After the resist film on the substrate is subjected to exposure processing in the exposure device, the substrate is transported to the development processing block via the interface block. After the resist film on the substrate is subjected to development processing to form a resist pattern thereon in the development processing block, the substrate is transported to the indexer block.

With recent increases in density and integration of devices, making finer resist patterns has become an important problem. Conventional exposure devices have generally performed exposure processing by reduction-projecting a reticle pattern on a substrate through a projection lens. With such conventional exposure devices, however, the line width of an exposure pattern is determined by the wavelength of a light source of the exposure device. Therefore, making finer resist patterns has had a limitation.

Therefore, an immersion method is known as a projection exposure method allowing for even finer exposure patterns (see, e.g., WO 99/49504 pamphlet). In a projection exposure device according to the WO 99/49504 pamphlet, an area between a projection optical system and a substrate is filled with a liquid, resulting in a shorter wavelength of exposure light on a main surface of the substrate. This allows for even finer exposure patterns.

BRIEF SUMMARY OF THE INVENTION

In the projection exposure device according to the above-mentioned WO 99/49504 pamphlet, however, exposure processing is performed with the substrate and the liquid brought into contact with each other. When a contaminant adheres to the substrate before the exposure processing, the contaminant is mixed into the liquid.

Although the substrate is subjected to various types of film formation processing before the exposure processing, an edge of the substrate may, in some cases, be contaminated in the process of the film formation processing. When the substrate is subjected to the exposure processing with the edge of the substrate thus contaminated, a defective dimension and a defective shape of an exposure pattern may occur.

An object of the present invention is to provide a substrate processing apparatus and a substrate processing method in which a processing defect of a substrate due to contamination at an edge of the substrate can be prevented.

(1) According to one aspect of the present invention, a substrate processing apparatus that performs predetermined processing on a substrate having one surface and the other surface includes one or plurality of processing liquid supply units that supplies a processing liquid to the one surface of the substrate, a first temperature processing unit that performs temperature processing on the substrate before the processing liquid is supplied or after the processing liquid is supplied by the one or plurality of processing liquid supply units, a first transport device, having a first holder that holds the other surface of the substrate without coming into contact with an edge of the substrate, configured to transport the substrate by moving the first holder, and a controller that controls the first transport device such that the substrate is transported between any one of the one or plurality of processing liquid supply units and the first temperature processing unit, wherein each of the one or plurality of processing liquid supply units includes a second holder that holds the other surface of the substrate without coming into contact with the edge of the substrate, and a liquid supply mechanism that supplies a coating liquid for a photosensitive film or a development liquid to the one surface of the substrate held by the second holder as the processing liquid, and the first temperature processing unit includes a third holder that holds the other surface of the substrate without coming into contact with the edge of the substrate, and a first temperature processing device that performs the temperature processing on the substrate held by the third holder.

In the substrate processing apparatus, the substrate is transported by the first transport device between any one of the one or plurality of processing liquid supply units and the first temperature processing unit. The first holder holds the other surface of the substrate without coming into contact with the edge of the substrate during transportation of the substrate by the first transport device. In each of the one or plurality of processing liquid supply units, the processing liquid is supplied to the one surface of the substrate while the second holder holds the other surface of the substrate without coming into contact with the edge of the substrate. In the first temperature processing unit, the temperature processing is performed on the substrate while the third holder holds the other surface of the substrate without coming into contact with the edge of the substrate.

In this manner, the first, second and third holders do not come into contact with the edge of the substrate during transportation of the substrate by the first transport device, during supply of the processing liquid to the one surface of the substrate by the one or plurality of processing liquid supply units and during the temperature processing for the substrate by the first temperature processing unit. Thus, a contaminant that occurs when a member for holding the substrate comes into contact with the edge of the substrate is prevented. Further, a contaminant is prevented from being transferred from the first, second and third holders to the edge of the substrate. As a result, a processing defect of the substrate due to contamination at the edge of the substrate is prevented.

(2) Each of the first holder, the second holder and the third holder may have a suction holding mechanism that sucks the other surface of the substrate.

In this case, each of the first holder, the second holder and the third holder can hold the other surface of the substrate without coming into contact with the edge of the substrate with a simple configuration.

(3) The one or plurality of processing liquid supply units may include the plurality of processing liquid supply units, a liquid supply mechanism of one processing liquid supply unit of the plurality of processing liquid supply units may be configured to supply the coating liquid for the photosensitive film to the one surface of the substrate, and a liquid supply mechanism of another processing liquid supply unit of the plurality of processing liquid supply units may be configured to supply the development liquid to the one surface of the substrate.

In this case, the coating liquid for the photosensitive film is supplied to the one surface of the substrate by the liquid supply mechanism of the one processing liquid supply unit, so that the photosensitive film formation processing is performed on the one surface of the substrate. After the photosensitive film formed on the one surface of the substrate is exposed, the development liquid is supplied to the one surface of the substrate by the liquid supply mechanism of another processing liquid supply unit. Thus, the development processing is performed on the substrate.

The configuration of the present invention enables the photosensitive film formation processing in photolithography and the development processing for the substrate to be concurrently performed in the substrate processing apparatus while preventing contamination at the edge of the substrate.

(4) The substrate processing apparatus may include a processing section that includes the plurality of processing liquid supply units, the first temperature processing unit and the first transport device, a carry-in/carry-out section, provided to be adjacent to one end of the processing section, configured to carry in and carry out the substrate to/from the processing section, and an interface section, arranged between the other end of the processing section and an exposure device that performs exposure processing on the substrate, configured to receive and transfer the substrate between the processing section and the exposure device.

In this case, the substrate is carried in from the carry-in/carry-out section to the processing section. In the processing section, the photosensitive film is formed on the one surface of the substrate by the one processing liquid supply unit. The substrate on which the photosensitive film is formed is received from the processing section by the interface section, and transferred to the exposure device. In the exposure device, the exposure processing is performed on the photosensitive film on the substrate of which the edge is kept clean. The substrate after the exposure processing is received from the exposure device by the interface section and transferred to the processing section. In the processing section, the development liquid is supplied on the one surface of the substrate after the exposure processing by another processing liquid supply unit, so that the photosensitive film is developed. The substrate after the development is carried out from the processing section to the carry-in/carry-out section.

In this manner, the photosensitive film formation before the exposure processing and the development of the photosensitive film after the exposure processing are smoothly performed while the edge of the substrate is kept clean.

(5) At least one of the processing section and the interface section may include one or plurality of cleaning units that cleans the other surface of the substrate, and each of the one or plurality of cleaning units may include a fourth holder that holds the other surface of the substrate without coming into contact with the edge of the substrate and a cleaning mechanism that cleans the other surface of the substrate held by the fourth holder.

In this case, in each of the one or plurality of cleaning units, the other surface of the substrate is cleaned while the fourth holder holds the other surface of the substrate without coming into contact with the edge of the substrate. Thus, a contaminant, that occurs when a member for holding the substrate comes into contact with the edge of the substrate, is prevented while the other surface of the substrate is cleaned. Further, a contaminant is prevented from being transferred from the fourth holder to the edge of the substrate.

(6) The fourth holder may include a first suction holding mechanism that sucks a first portion on the other surface of the substrate, and a second suction holding mechanism that sucks a second portion different from the first portion on the other surface of the substrate, and the cleaning mechanism may be configured to clean a region except for the first portion on the other surface of the substrate while the substrate is held by the first suction holding mechanism and the substrate is not held by the second suction holding mechanism, and may be configured to clean a region except for the second portion on the other surface of the substrate while the substrate is held by the second suction holding mechanism and the substrate is not held by the first suction holding mechanism.

In this case, in each of the one or plurality of cleaning units, the region except for the first portion on the other surface of the substrate is cleaned while the first portion on the other surface of the substrate is held by the first suction holding mechanism and the substrate is not held by the second suction holding mechanism. Further, the region except for the second portion on the other surface of the substrate is cleaned while the second portion on the other surface of the substrate is held by the second suction holding mechanism and the substrate is not held by the first suction holding mechanism.

In this manner, the region except for the first portion on the other surface of the substrate and the region except for the second portion on the other surface of the substrate are cleaned in this order such that the other entire surface of the substrate can be cleaned while the other surface of the substrate is held.

(7) Each of the one or plurality of cleaning units may further include a switch mechanism that switches the first suction holding mechanism between a suction state in which the first portion is sucked and a released state in which suction of the first portion is released, and switches the second suction holding mechanism between a suction state in which the second portion is sucked and a released state in which suction of the second portion is released.

In this case, the first suction holding mechanism is switched between the suction state and the released state, and the second suction holding mechanism is switched between the suction state and the released state by the switch mechanism. Thus, the region except for the first portion on the other surface of the substrate and the region except for the second portion on the other surface of the substrate can be smoothly cleaned.

(8) The cleaning mechanism may include a cleaner configured such that it can come into contact with the other surface of the substrate, and a cleaner moving mechanism that brings the cleaner into contact with the other surface of the substrate and moves the cleaner relative to the substrate held by the first or second suction holding mechanism.

In this case, the cleaner comes into contact with the other surface of the substrate while the other surface of the substrate is held by the first or second suction holding mechanism. Further, the cleaner is moved relative to the first or second suction holding mechanism. Thus, it is possible to physically clean the other surface of the substrate by the cleaner without holding the edge of the substrate and moving the substrate.

(9) Each of the one or plurality of cleaning units may be configured to clean the other surface of the substrate before the exposure processing by the exposure device.

In this case, the other surface of the substrate before the exposure processing by the exposure device is cleaned such that defocusing that occurs due to a contaminant on the other surface of the substrate is prevented.

(10) The interface section, having a fifth holder that holds the other surface of the substrate without coming into contact with the edge of the substrate, may include a second transport device configured to transport the substrate by moving the fifth holder, and the controller may control the second transport device such that the substrate is transported between the processing section and the exposure device.

In this case, in the interface section, the substrate is transported between the processing section and the exposure device by the second transport device. The fifth holder holds the other surface of the substrate without coming into contact with the edge of the substrate during transportation of the substrate by the second transport device.

Thus, a contaminant that occurs when a member for holding the substrate comes into contact with the edge of the substrate is prevented during transportation of the substrate in the interface section. Further, a contaminant is prevented from being transferred from the fifth holder to the edge of the substrate.

(11) The fifth holder may have a suction holding mechanism that sucks the other surface of the substrate.

In this case, the fifth holder can hold the other surface of the substrate without coming into contact with the edge of the substrate with a simple configuration.

(12) The substrate processing apparatus may further include a second temperature processing unit that performs temperature processing on the substrate before the processing liquid is supplied or after the processing liquid is supplied by the one or plurality of processing liquid supply units, wherein the second temperature processing unit may have a cooling section that performs cooling processing on the substrate, a heating section that performs heating processing on the substrate, and a third transport device, having a sixth holder that holds the other surface of the substrate without coming into contact with the edge of the substrate, may be configured to transport the substrate by moving the sixth holder, and the cooling section may include a cooling device that performs cooling processing on the substrate held by the sixth holder by coming into contact with the sixth holder, the heating section may include a seventh holder that holds the other surface of the substrate without coming into contact with the edge of the substrate, and a heating device that performs heating processing on the substrate held by the seventh holder, and the controller may control the third transport device such that the sixth holder that holds the substrate comes into contact with the cooling device, and may control the third transport device such that the substrate held by the sixth holder is transported between the cooling section and the heating section and the substrate is received and transferred between the sixth holder and the seventh holder in the heating section.

In this case, in the second temperature processing unit, the sixth holder of the third transport device holds the other surface of the substrate without coming into contact with the edge of the substrate. The sixth holder that holds the substrate is moved such that the substrate is transported between the cooling section and the heating section.

In the cooling section, the sixth holder that holds the substrate comes into contact with the cooling device in the cooling section such that the cooling processing is performed on the substrate. In the heating section, the substrate is received and transferred between the sixth holder and the seventh holder. The substrate is transferred from the sixth holder to the seventh holder such that the seventh holder holds the other surface of the substrate without coming into contact with the edge of the substrate. The heating processing is performed while the seventh holder holds the other surface of the substrate.

Thus, in the second temperature processing unit, the substrate is transported between the cooling section and the heating section such that the cooling processing and the heating processing for the substrate can be successively performed. Further, the sixth and seventh holders do not come into contact with the edge of the substrate during transportation of the substrate by the third transport device, during the cooling processing for the substrate by the cooling section and during the heating processing by the heating section. Thus, the cooling processing and the heating processing for the substrate can be quickly performed while a contaminant is prevented from occurring at the edge of the substrate and being transferred to the edge of the substrate.

(13) According to another aspect of the present invention, a substrate processing method in which predetermined processing is performed on a substrate having one surface and the other surface by using a substrate processing apparatus, includes the steps of holding the other surface of the substrate using a first holder without coming into contact with an edge of the substrate and transporting the substrate between any one of one or plurality of processing liquid supply units and a temperature processing unit by moving the first holder, holding the other surface of the substrate in each of the one or plurality of processing liquid supply units using a second holder without coming into contact with the edge of the substrate and supplying a coating liquid for a photosensitive film or a development liquid to the one surface of the substrate held by the second holder as a processing liquid, and holding the other surface of the substrate in the temperature processing unit using the third holder without coming into contact with the edge of the substrate and performing temperature processing on the substrate held by the third holder.

In the substrate processing method, the substrate is transported between any one of the one or plurality of processing liquid supply units and the first temperature processing unit. The first holder holds the other surface of the substrate without coming into contact with the edge of the substrate during transportation of the substrate. In each of the one or plurality of processing liquid supply units, the processing liquid is supplied to the one surface of the substrate while the second holder holds the other surface of the substrate without coming into contact with the edge of the substrate. In the temperature processing unit, the temperature processing is performed on the substrate while the third holder holds the other surface of the substrate without coming into contact with the edge of the substrate.

In this manner, the first, second and third holders do not come into contact with the edge of the substrate during transportation of the substrate, during supply of the processing liquid to the one surface of the substrate by the one or plurality of processing liquid supply units and during the temperature processing for the substrate by the temperature processing unit. Thus, a contaminant that occurs when a member for holding the substrate comes into contact with the edge of the substrate is prevented. Further, a contaminant is prevented from being transferred from the first, second and third holders to the edge of the substrate. As a result, a processing defect of the substrate due to contamination at the edge of the substrate is prevented.

Other features, elements, characteristics, and advantages of the present invention will become more apparent from the following description of preferred embodiments of the present invention with reference to the attached drawings.

BRIEF DESCRIPTION OF THE SEVERAL VIEWS OF DRAWINGS

Figure 27:
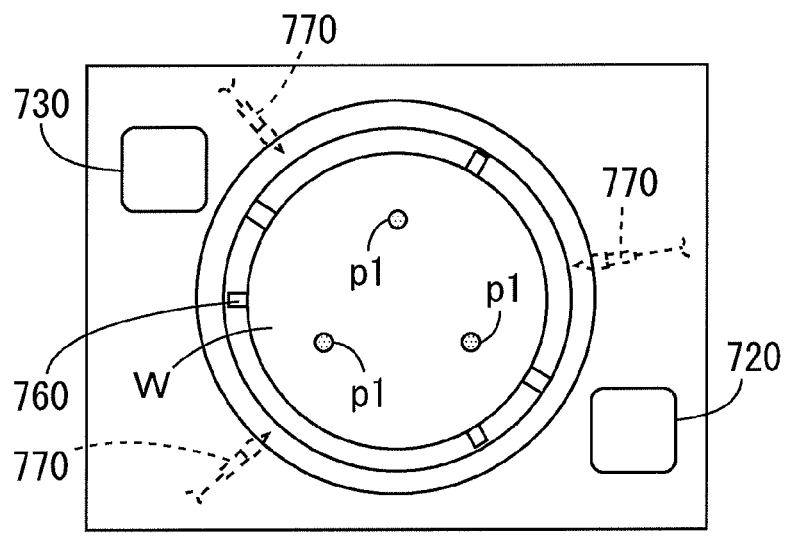
Figure 27:
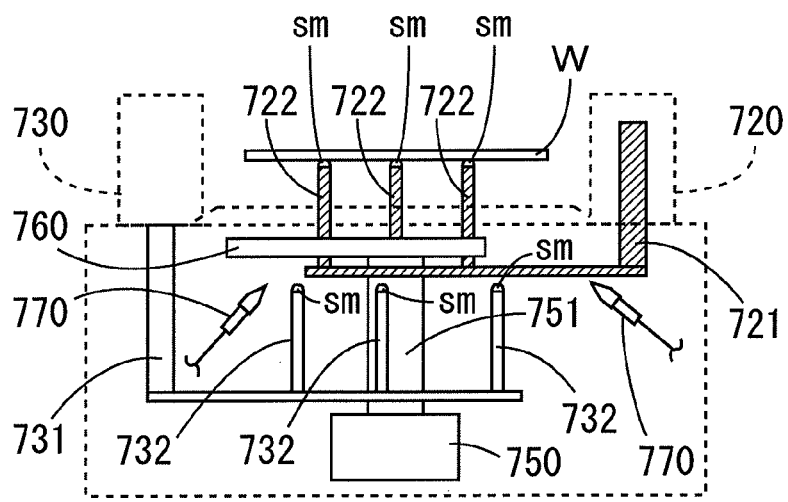

FIGS. 27(a) and 27(b) are a plan view and a side view showing the operation of the back surface cleaning unit;

FIGS. 28(a) and 28(b) are a plan view and a side view showing the operation of the back surface cleaning unit;

FIGS. 29(a) and 29(b) are a plan view and a side view showing the operation of the back surface cleaning unit;

FIGS. 30(a) and 30(b) are a plan view and a side view showing the operation of the back surface cleaning unit;

FIGS. 31(a) and 31(b) are a plan view and a side view showing the operation of the back surface cleaning unit;

FIGS. 32(a) and 32(b) are a plan view and a side view showing the operation of the back surface cleaning unit;

FIGS. 33(a) and 33(b) are a plan view and a side view showing the operation of the back surface cleaning unit; and FIGS. 34(a) to 34(c) are diagrams for explaining a peripheral edge and an edge of the substrate defined in one embodiment of the present invention.

DESCRIPTION OF THE PREFERRED EMBODIMENTS

A substrate processing apparatus and a substrate processing method according to one embodiment of the invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask and the like.

(1) Configuration of Substrate Processing System

Figure 1:
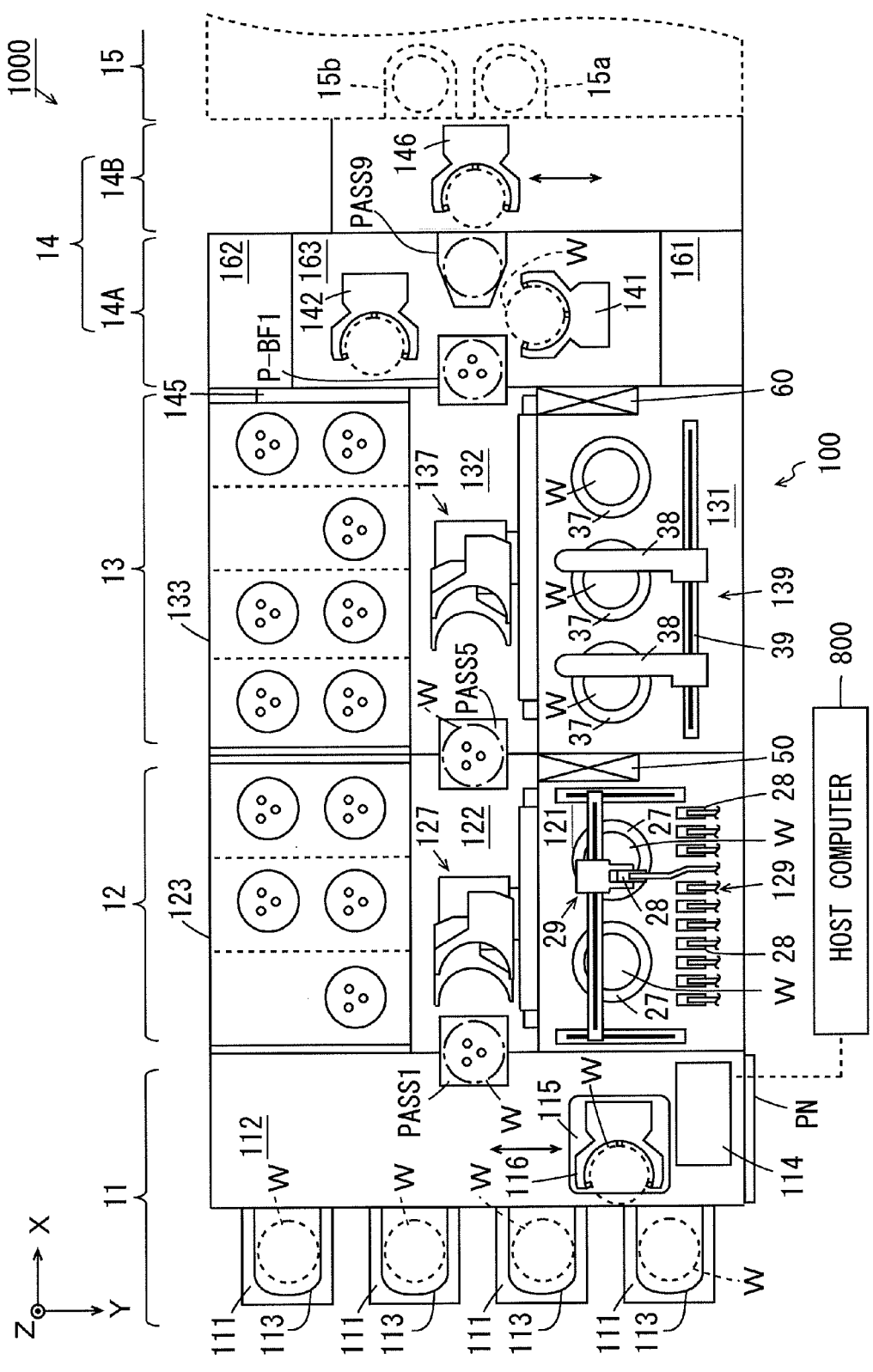
FIG. 1 is a schematic plan view of a substrate processing system according to one embodiment of the present invention.

FIG. 1 is a schematic plan view of a substrate processing system according to the one embodiment of the present invention. FIG. 1 and subsequent given diagrams are accompanied by the arrows that indicate X, Y, and Z directions orthogonal to one another for clarity of a positional relationship. The X and Y directions are orthogonal to each other within a horizontal plane and the Z direction corresponds to a vertical direction. In each of the directions, a direction directed by the arrow is a + direction, and a direction opposite thereto is a − direction.

As shown in FIG. 1, the substrate processing system 1000 includes the substrate processing apparatus 100 and a host computer 800.

The substrate processing apparatus 100 includes an indexer block 11, a first processing block 12, a second processing block 13, a cleaning/drying processing block 14A and a carry-in/carry-out block 14B. An interface block 14 is constituted by the cleaning/drying processing block 14A and the carry-in/carry-out block 14B. An exposure device 15 is arranged to be adjacent to the carry-in/carry-out block 14B.

The unprocessed substrate W that has been carried into the indexer block 11 is transported to the exposure device 15 via the first processing block 12, the second processing block 13 and the interface block 14. In the exposure device 15, exposure processing is performed on the substrate W by a liquid immersion method. Thereafter, the substrate W after the exposure processing by the exposure device 15 is transported to the indexer block 11 via the interface block 14, the second processing block 13 and the first processing block 12. Predetermined processing is performed on the substrate W in each block 12, 13, 14. Details of the processing to be performed on the substrate W in each block 12, 13, 14 will be described below.

In the substrate processing apparatus 100, a member that holds the substrate W or a member that supports the substrate W does not come into contact with an edge of the substrate W during a period in which the substrate W is transported from the indexer block 11 to the exposure device 15 while being processed and during a period in which the substrate W is transported from the exposure device 15 to the indexer block 11 while being processed. Thus, a contaminant that occurs when a holding member or a support member of the substrate W comes into contact with the edge of the substrate W is prevented. Further, a contaminant is prevented from being transferred to the edge of the substrate W. Definition of the edge of the substrate W in this embodiment will be described below.

As shown in FIG. 1, the indexer block 11 includes a plurality of carrier platforms 111 and a transport section 112. A carrier 113 in which the plurality of substrates W are stored in multiple stages is placed on each carrier platform 111.

The transport section 112 is provided with a controller 114 and a transport mechanism 115. The controller 114 controls each constituent element in the substrate processing apparatus 100. The controller 114 is connected to the host computer 800 by wire communication or wireless communication. Various types of data are transmitted and received between the controller 114 and the host computer 800.

Figure 5:
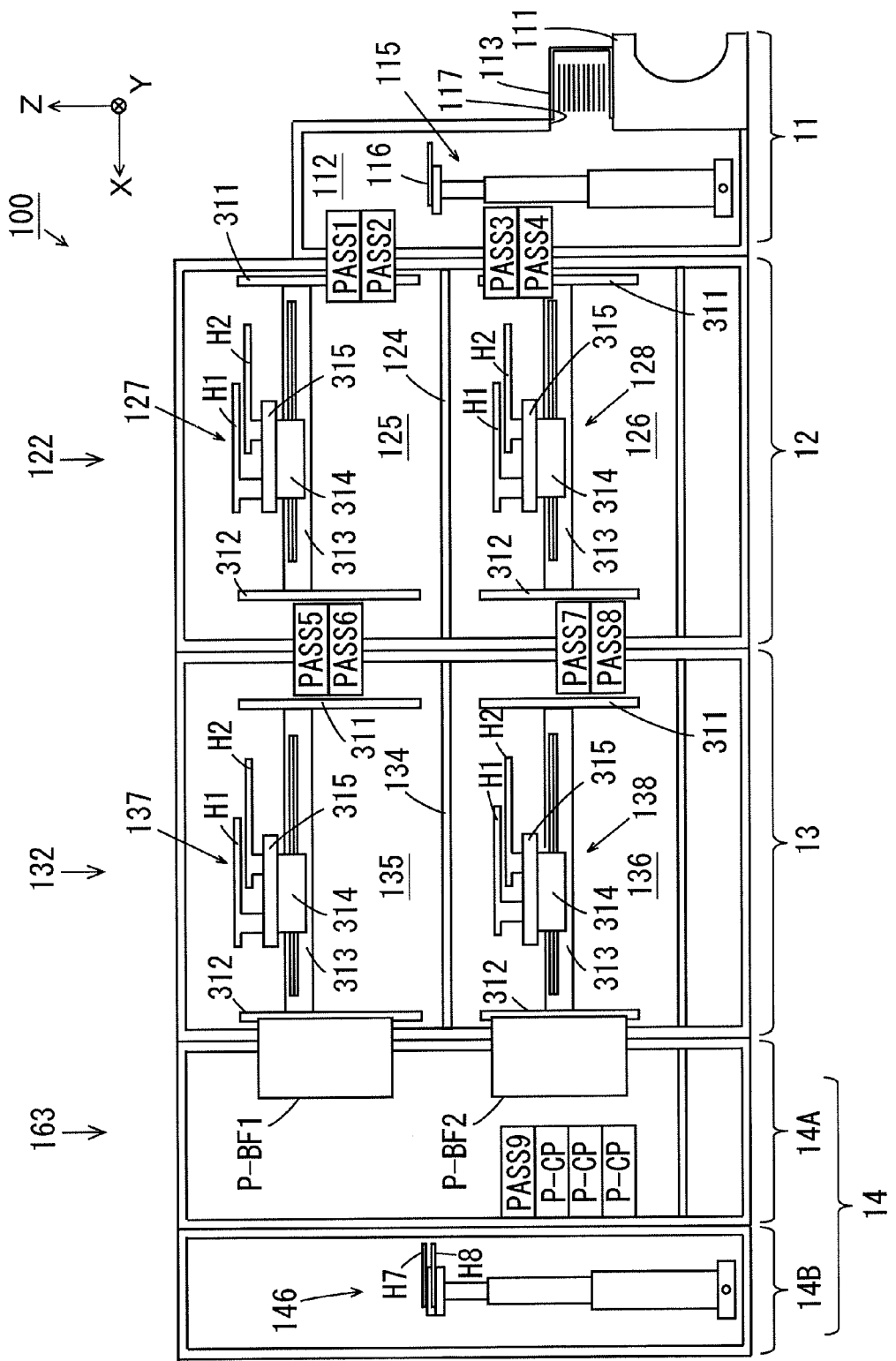
FIG. 5 is a side view mainly showing the transport section of FIG. 1.

The transport mechanism 115 has a hand 116 for holding the substrate W. The hand 116 can hold the back surface of the substrate W by suction without coming into contact with the edge of the substrate W. Details of the hand 116 will be described below. The transport mechanism 115 transports the substrate W while holding the same using the hand 116. Further, as shown in FIG. 5, described below, an opening 117 for receiving and transferring the substrate W between the carrier 113 and the transport mechanism 115 is formed at the transport section 112.

A main panel PN is provided on a side surface of the transport section 112. The main panel PN is connected to the controller 114. A user can confirm a processing status of the substrate W in the substrate processing apparatus 100 using the main panel PN.

An operation unit (not shown) composed of a keyboard, for example, is provided in the vicinity of the main panel PN. The user can perform operation setting and the like of the substrate processing apparatus 100 by operating the operation unit.

The first processing block 12 includes a coating processing section 121, a transport section 122 and a thermal processing section 123. The coating processing section 121 and the thermal processing section 123 are provided to be opposite to each other with the transport section 122 sandwiched therebetween. A substrate platform PASS1 and after-mentioned substrate platforms PASS2 to PASS4 (see FIG. 5) on which the substrates W are placed are provided between the transport section 122 and the indexer block 11. A plurality of support pins (not shown) that support the back surface of the substrate W without coming into contact with the back surface of the substrate W are provided at the substrate platforms PASS1 to PASS4. A transport mechanism 127 and an after-mentioned transport mechanism 128 (see FIG. 5) that transport the substrates W are provided in the transport section 122.

The second processing block 13 includes a coating/development processing section 131, a transport section 132 and a thermal processing section 133. The coating/development processing section 131 and the thermal processing section 133 are provided to be opposite to each other with the transport section 132 sandwiched therebetween. A substrate platform PASS5 and an after-mentioned substrate platforms PASS6 to PASS8 (see FIG. 5) on which the substrates W are placed are provided between the transport section 132 and the transport section 122. The substrate platforms PASS5 to PASS8 (see FIG. 5) have the same configuration as the aforementioned substrate platforms PASS1 to PASS4 (see FIG. 5). A transport mechanism 137 and an after-mentioned transport mechanism 138 (see FIG. 5) that transport the substrates W are provided in the transport section 132. A packing 145 is provided between the thermal processing section 133 and the interface block 14 in the second processing block 13.

The cleaning/drying processing block 14A includes cleaning/drying processing sections 161, 162 and a transport section 163. The cleaning/drying processing sections 161, 162 are provided to be opposite to each other with the transport section 163 sandwiched therebetween. Transport mechanisms 141, 142 are provided in the transport section 163.

A placement/buffer section P-BF1 and an after-mentioned placement/buffer section P-BF2 (see FIG. 5) are provided between the transport section 163 and the transport section 132. The placement/buffer sections P-BF1, P-BF2 are configured to be capable of storing the plurality of substrates W. In each placement/buffer section P-BF1, P-BF2, the plurality of stored substrates W are respectively supported by support members (not shown). The support members provided in the placement/buffer sections P-BF1, P-BF2 are configured to support the back surfaces of the substrates W without coming into contact with the edges of the substrates W.

Further, a substrate platform PASS9 and after-mentioned placement/cooling platforms P-CP (see FIG. 5) are provided to be adjacent to the carry-in/carry-out block 14B between the transport mechanisms 141, 142. The substrate platform PASS9 has the same configuration as the aforementioned substrate platforms PASS1 to PASS4 (see FIG. 5). The placement/cooling platform P-CP has a function of cooling the substrate W (a cooling plate, for example) and the similar configuration to an after-mentioned cooling unit CP (see FIG. 3). The substrate W is cooled to a temperature suitable for the exposure processing in each placement/cooling platform P-CP.

A transport mechanism 146 is provided in the carry-in/carry-out block 14B. The transport mechanism 146 has hands H7, H8 (see FIG. 5) for holding the substrates W. The hands H7, H8 can hold the back surface of the substrate W by suction without coming into contact with the edge of the substrate W. Details of the hands H7, H8 will be described below.

The transport mechanism 146 carries in and carries out the substrate W to/from the exposure device 15. A substrate inlet 15*a* for carrying in the substrate W and a substrate outlet 15*b* for carrying out the substrate W are provided in the exposure device 15. The substrate inlet 15*a* and the substrate outlet 15*b* in the exposure device 15 may be arranged to be adjacent to each other in a horizontal direction or a vertical direction.

Figure 2:
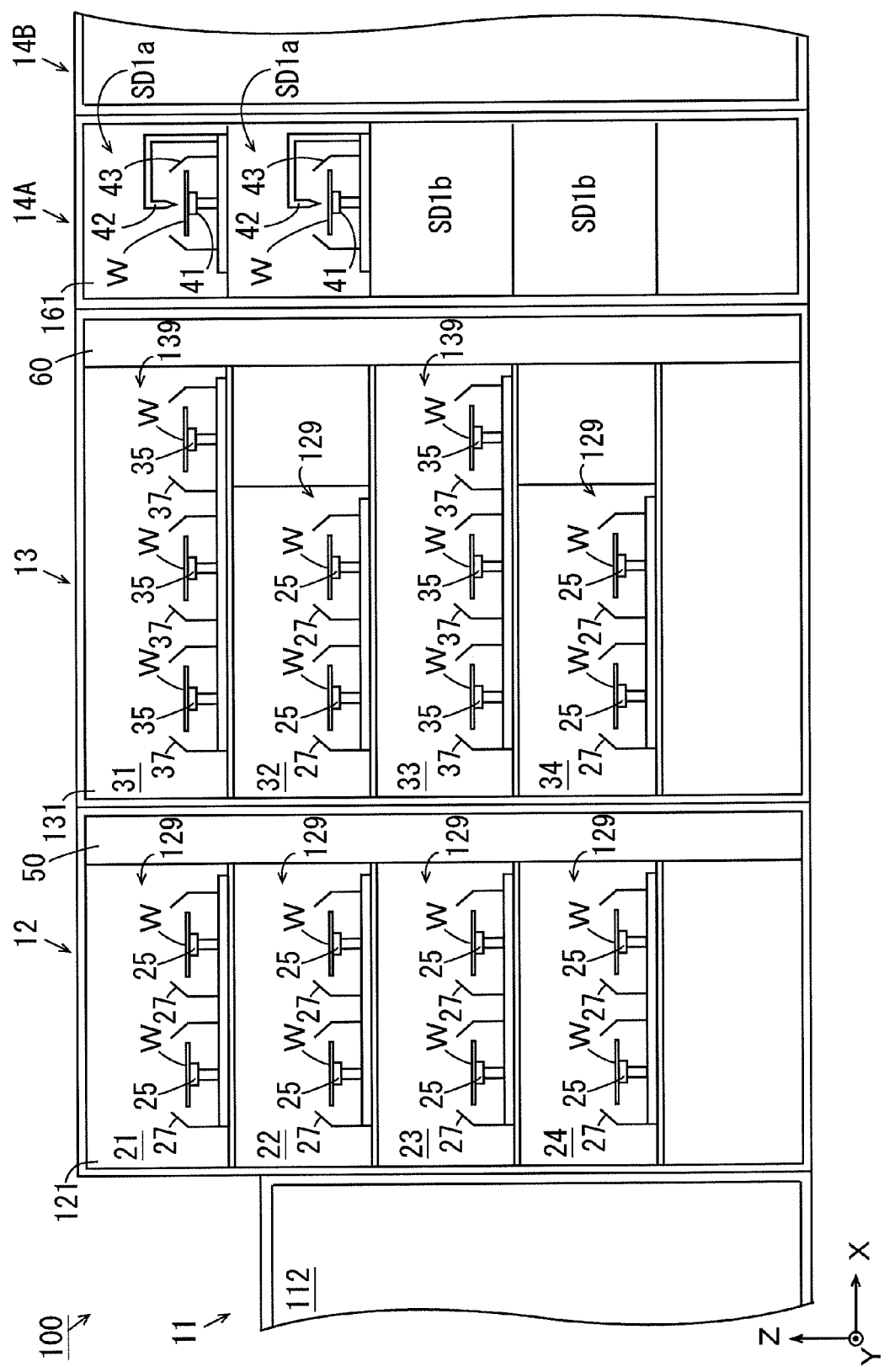
FIG. 2 is a side view of one side of the substrate processing system mainly showing a coating processing section, a coating/development processing section, a cleaning/drying processing section of FIG. 1.

(2) Configuration of Coating Processing Section and Development Processing Section FIG. 2 is a side view of one side of the substrate processing system 1000 mainly showing the coating processing section 121, the coating/development processing section 131 and the cleaning/drying processing section 161 of FIG. 1.

As shown in FIG. 2, coating processing chambers 21, 22, 23, 24 are provided in a stack in the coating processing section 121. A coating processing unit 129 is provided in each coating processing chamber 21 to 24. Development processing chambers 31, 33 and coating processing chambers 32, 34 are provided in a stack in the coating/development processing section 131. A development processing unit 139 is provided in each development processing chamber 31, 33, and the coating processing unit 129 is provided in each coating processing chamber 32, 34.

Each coating processing unit 129 includes spin chucks 25 that hold the center of the back surface of the substrate W by suction, and cups 27 provided to cover the surroundings of the spin chucks 25. In the present embodiment, the two spin chucks 25 and the two cups 27 are provided in each coating processing unit 129. Each spin chuck 25 is driven to be rotated by a driving device (an electric motor, for example) that is not shown.

Further, as shown in FIG. 1, each coating processing unit 129 includes a plurality of nozzles 28 that discharge a processing liquid and a nozzle transport mechanism 29 that transports the nozzles 28.

In the coating processing unit 129, any one of the plurality of nozzles 28 is moved to above the substrate W by the nozzle transport mechanism 29. Then, the processing liquid is discharged from the nozzle 28, so that the processing liquid is supplied on the one surface of the substrate W held by the spin chuck 25. When the processing liquid is supplied to the substrate W from each nozzle 28, the spin chuck 25 is rotated by the driving device (not shown). Thus, the substrate W is rotated.

In the coating processing unit 129 in the coating processing chambers 22, 24 of this example, a coating liquid for an anti-reflection film is supplied on the one surface of the substrate W from the nozzle 28 as the processing liquid. In the coating processing unit 129 in the coating processing chambers 21, 23, a coating liquid for a resist film is supplied on the one surface of the substrate W from the nozzle 28 as the processing liquid. In the coating processing unit 129 in the coating processing chambers 32, 34, a coating liquid for a resist cover film is supplied on the one surface of the substrate W from the nozzle 28 as the processing liquid.

In the following description, the one surface of the substrate W to which the coating liquid for a resist film is supplied is referred to as a main surface, and the other surface of the substrate W opposite to the main surface is referred to as a back surface.

As shown in FIG. 2, the development processing unit 139 includes spin chucks 35 and cups 37 similarly to the coating processing unit 129. Further, as shown in FIG. 1, the development processing unit 139 includes two slit nozzles 38 that discharge a development liquid and a moving mechanism 39 that moves the slit nozzles 38 in the X direction.

In the development processing unit 139, the one slit nozzle 38 first supplies the development liquid on the main surface of each substrate W while being moved in the X direction. Thereafter, the development liquid is supplied on the main surface of each substrate W while the other slit nozzle 38 is being moved. When the development liquid is supplied to the substrate W from each slit nozzle 38, each spin chuck 35 is rotated by a driving device (not shown). Thus, the substrate W is rotated.

In the present embodiment, the development liquid is supplied to the substrate W in the development processing unit 139, whereby a resist cover film on the substrate W is removed, and the development processing for the substrate W is performed. Further, in the present embodiment, development liquids different from each other are discharged from the two slit nozzles 38. Thus, two types of the development liquids can be supplied to each substrate W.

While the coating processing unit 129 has the two spin chucks 25 and the two cups 27, and the development processing unit 139 has the three spin chucks 35 and the three cups 37 in the example of FIG. 2, the invention is not limited to this. The numbers of the spin chucks 25, 35 and the cups 27, 37 may be arbitrarily changed.

A plurality (two in this example) of cleaning/drying processing units SD1a and a plurality (two in this example) of back surface cleaning units SD1b are provided in the cleaning/drying processing section 161.

Each cleaning/drying processing unit SD1a includes a spin chuck 41 that holds the center of the back surface of the substrate W by suction and a cup 43 provided to cover the surroundings of the spin chuck 41. Each spin chuck 41 is driven to be rotated by a driving device (an electric motor, for example) that is not shown. Further, each cleaning/drying processing unit SD1a includes a nozzle 42 for discharging a cleaning liquid.

The spin chuck 41 is rotated by the driving device (not shown) while the substrate W is held by the spin chuck 41, so that the substrate W is rotated. The cleaning liquid is discharged from the nozzle 42 toward the center of the main surface of the rotating substrate W, so that the main surface of the substrate W is cleaned. Thereafter, supply of the cleaning liquid from the nozzle 42 to the substrate W is stopped, and the rotation speed of the spin chuck 41 increases. Thus, the cleaning liquid adhering to the substrate W is shaken off, so that the substrate W is dried. Thus, in each cleaning/drying processing unit SD1a, cleaning and drying processing for the main surface of the substrate W before the exposure processing is performed.

Cleaning processing for the back surface of the substrate W before the exposure processing is performed in each back surface cleaning unit SD1b. Details of each back surface cleaning unit SD1b will be described below.

As shown in FIGS. 1 and 2, a fluid box 50 is provided in the coating processing section 121 to be adjacent to the coating/development processing section 131. Similarly, a fluid box 60 is provided in the coating/development processing section 131 to be adjacent to the cleaning/drying processing block 14A. The fluid box 50 and the fluid box 60 each house fluid related elements such as a pipe, a joint, a valve, a flowmeter, a regulator, a pump and a temperature adjuster used to supply a chemical liquid to the coating processing units 129 and the development processing units 139 and discharge the liquid and air out of the coating processing units 129 and the development processing units 139.

(3) Configuration of Thermal Processing Section

Figure 3:
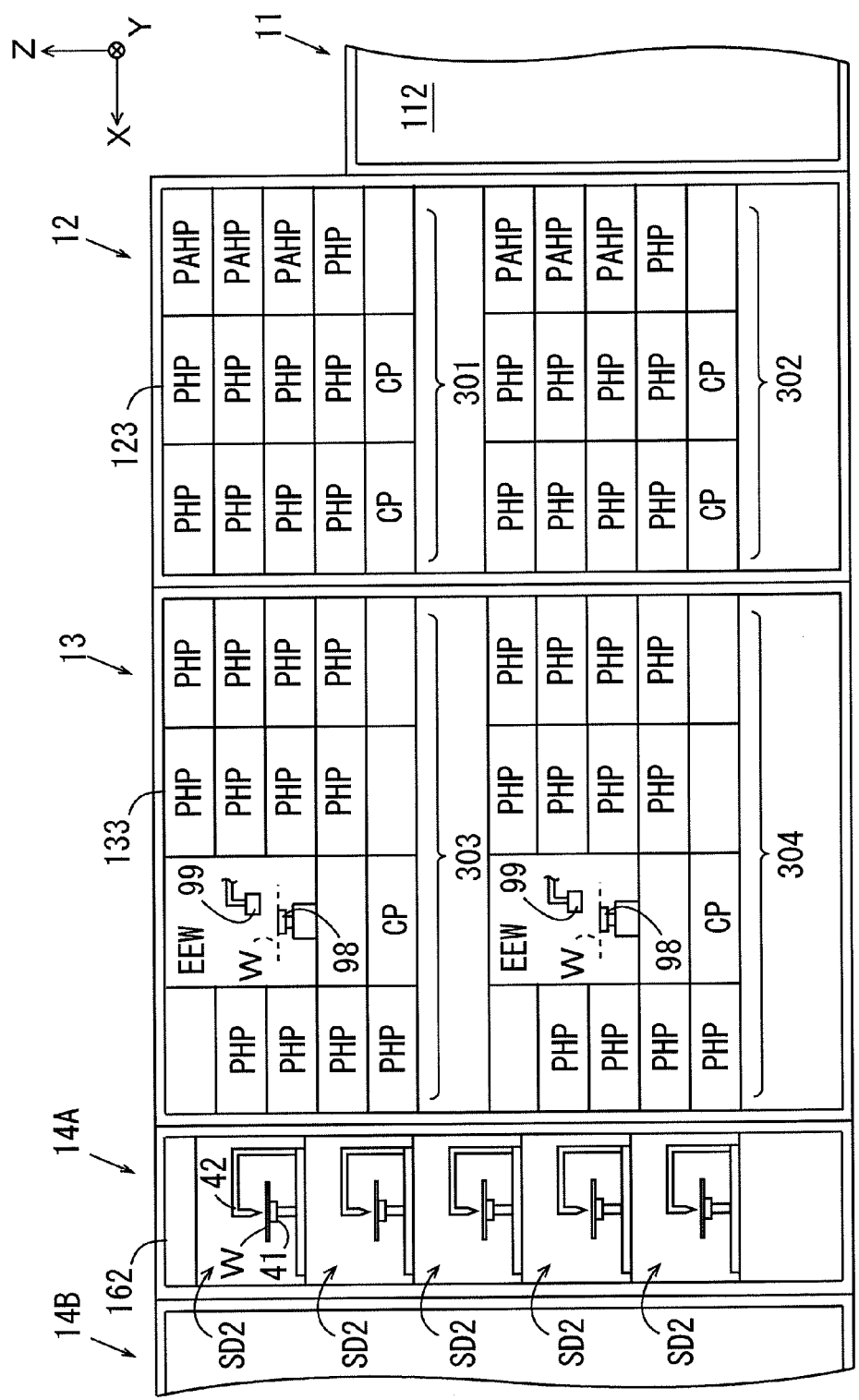
FIG. 3 is a side view of the other side of the substrate processing system mainly showing a thermal processing section and the cleaning/drying processing section of FIG. 1.

FIG. 3 is a side view of the other side of the substrate processing system 1000 mainly showing the thermal processing sections 123, 133 and the cleaning/drying processing section 162 of FIG. 1.

As shown in FIG. 3, the thermal processing section 123 has an upper thermal processing section 301 provided above and a lower thermal processing section 302 provided below. Each of the upper thermal processing section 301 and the lower thermal processing section 302 is provided with a plurality of thermal processing units PHP, a plurality of adhesion reinforcement processing units PAHP and a plurality of cooling units CP.

In each thermal processing unit PHP, heating processing and cooling processing for the substrate W are performed. Details of the thermal processing unit PHP will be described below. In each adhesion reinforcement processing unit PAHP, adhesion reinforcement processing for improving the adhesion between the substrate W and the anti-reflection film is performed. Specifically, in the adhesion reinforcement processing unit PAHP, an adhesion agent such as HMDS (hexamethyldisilazane) is applied to the substrate W, and the heating processing is performed on the substrate W. In the cooling unit CP, the cooling processing for the substrate W is performed. Each of the adhesion reinforcement processing units PAHP and the cooling units CP includes a substrate holding mechanism that can hold the substrate W without coming into contact with the edge of the substrate W such that the substrate W does not slide sideways. In the present embodiment, each of the adhesion reinforcement processing units PAHP and the cooling units CP includes a substrate suction sheet 220 (see FIG. 10) that holds the back surface of the substrate W by suction as one example of the aforementioned substrate holding mechanism. Further, each of the adhesion reinforcement processing units PAHP and the cooling units CP includes a temperature processing device 250 (see FIG. 10) that performs temperature processing on the substrate W held by the substrate suction sheet 220.

The thermal processing section 133 has an upper thermal processing section 303 provided above and a lower thermal processing section 304 provided below. Each of the upper thermal processing section 303 and the lower thermal processing section 304 is provided with the cooling unit CP, the plurality of thermal processing units PHP and an edge exposure unit EEW.

The edge exposure unit EEW includes a spin chuck 98 and a light emitter 99. The spin chuck 98 is configured to be capable of holding the center portion of the back surface of the substrate W by suction. The spin chuck 98 is driven to be rotated by a driving device (an electric motor, for example) that is not shown. Thus, the substrate W held by the spin chuck 98 is rotated.

Light is emitted from the light emitter 99 to the outer peripheral edge of the rotating substrate W held by the spin chuck 98. Thus, exposure processing (edge exposure processing) for the peripheral edge on the main surface of the substrate W is performed. Definition of the peripheral edge of the substrate W in the present embodiment will be described below.

The edge exposure processing is performed on the substrate W such that the resist film on the peripheral edge of the substrate W is removed during the subsequent development processing. Thus, the resist film on the peripheral edge of the substrate W is prevented from being stripped and becoming particles after the development processing.

A plurality (five in this example) of cleaning/drying processing units SD2 are provided in the cleaning/drying processing section 162. Each cleaning/drying processing unit SD2 has the same configuration as the cleaning/drying processing unit SD1a of FIG. 2. The cleaning and drying processing for the main surface of the substrate W after the exposure processing is performed in each cleaning/drying processing unit SD2.

(4) Configuration of Transport Section (4-1) Schematic Configuration

Figure 4:
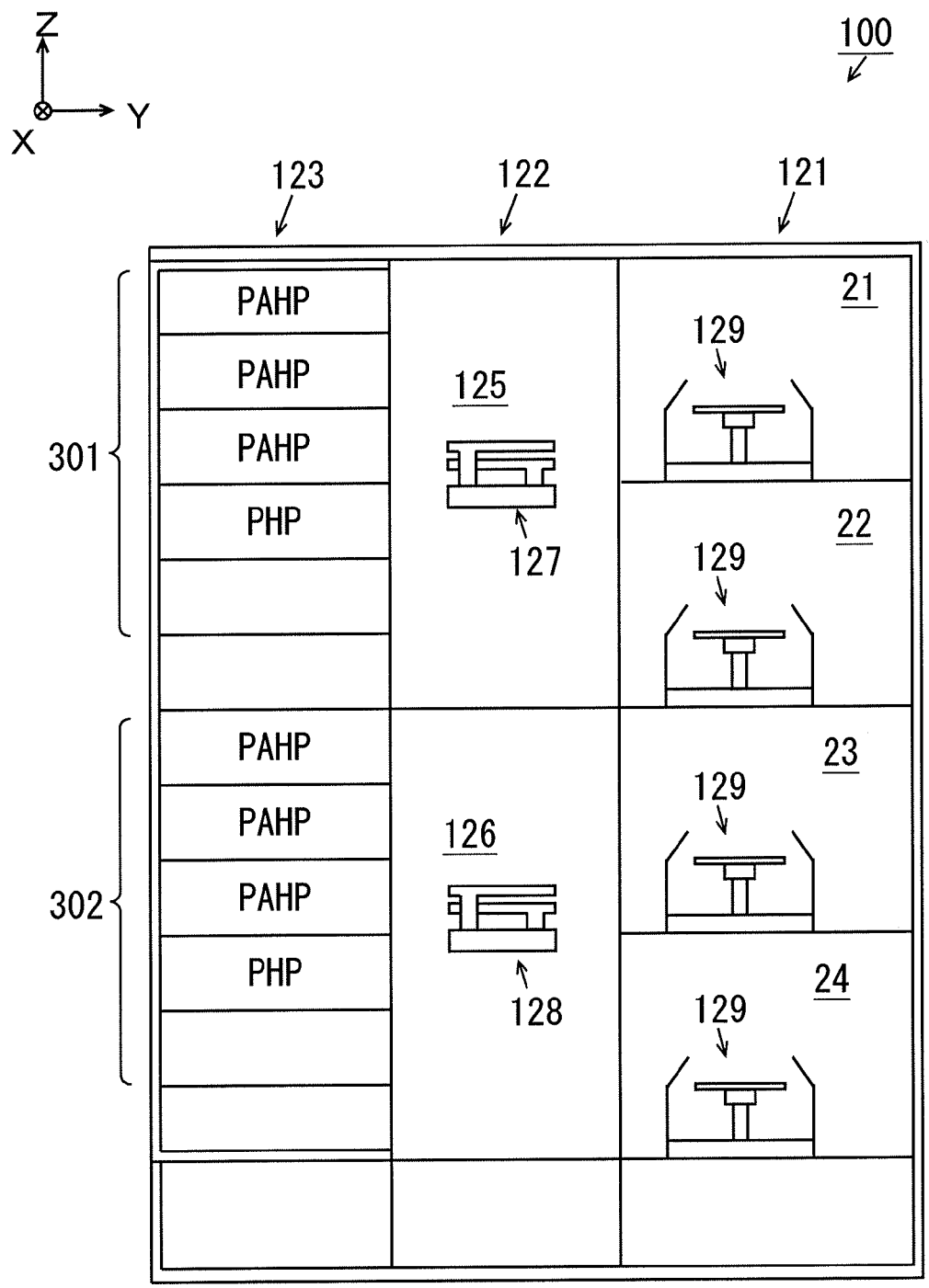
FIG. 4 is a side view mainly showing the coating processing section, a transport section and the thermal processing section of FIG. 1.

FIG. 4 is a side view mainly showing the coating processing section 121, the transport section 122 and the thermal processing section 123 of FIG. 1. FIG. 5 is a side view of the transport sections 122, 132, 163 of FIG. 1.

The transport section 122 has an upper transport chamber 125 and a lower transport chamber 126 as shown in FIGS. 4 and 5. The transport section 132 has an upper transport chamber 135 and a lower transport chamber 136.

The upper transport chamber 125 is provided with the transport mechanism 127, and the lower transport chamber 126 is provided with the transport mechanism 128. Further, the upper transport chamber 135 is provided with the transport mechanism 137, and the lower transport chamber 136 is provided with the transport mechanism 138.

As shown in FIG. 4, the upper thermal processing section 301 is provided to be opposite to the coating processing chambers 21, 22 with the upper transport chamber 125 sandwiched therebetween, and the lower thermal processing chamber 302 is provided to be opposite to the coating processing chambers 23, 24 with the lower transport chamber 126 sandwiched therebetween. Similarly, the upper thermal processing section 303 (FIG. 3) is provided to be opposite to the development processing chamber 31 and the coating processing chamber 32 (FIG. 2) with the upper transport chamber 135 (FIG. 5) sandwiched therebetween, and the lower thermal processing section 304 (FIG. 3) is provided to be opposite to the development processing chamber 33 and the coating processing chamber 34 (FIG. 2) with the lower transport chamber 136 (FIG. 5) sandwiched therebetween.

As shown in FIG. 5, the substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement/buffer section P-BF1 is provided between the upper transport chamber 135 and the transport section 163, and the placement/buffer section P-BF2 is provided between the lower transport chamber 136 and the transport section 163. The substrate platform PASS9 and the plurality of placement/cooling platforms P-CP are provided in the transport section 163 to be adjacent to the carry-in/carry-out block 14B.

The placement/buffer section P-BF1 is configured to be capable of carrying in and carrying out the substrates W by the transport mechanism 137 and the transport mechanisms 141, 142 (FIG. 1). The placement/buffer section P-BF2 is configured to be capable of carrying in and carrying out the substrates W by the transport mechanism 138 and the transport mechanisms 141, 142 (FIG. 1). Further, the substrate platform PASS9 and the placement/cooling platforms P-CP are configured to be capable of carrying in and carrying out the substrates W by the transport mechanisms 141, 142 (FIG. 1) and the transport mechanism 146.

While the only one substrate platform PASS9 is provided in the example of FIG. 5, the plurality of substrate platforms PASS9 may be provided one above the other. In this case, the plurality of substrate platforms PASS9 may be used as buffer sections for temporarily placing the substrates W.

The substrates W transported from the indexer block 11 to the first processing block 12 are placed on the substrate platform PASS1 and the substrate platform PASS3. The substrates W transported from the first processing block 12 to the indexer block 11 are placed on the substrate platform PASS2 and the substrate platform PASS4.

The substrates W transported from the first processing block 12 to the second processing block 13 are placed on the substrate platform PASS5 and the substrate platform PASS7. The substrates W transported from the second processing block 13 to the first processing block 12 are placed on the substrate platform PASS6 and the substrate platform PASS8.

The substrates W transported from the second processing block 13 to the cleaning/drying processing block 14A are placed on the placement/buffer sections P-BF1, P-BF2. The substrates W transported from the cleaning/drying processing block 14A to the carry-in/carry-out block 14B are placed on the placement/cooling platforms P-CP. The substrate W transported from the carry-in/carry-out block 14B to the cleaning/drying processing block 14A is placed on the substrate platform PASS9.

(4-2) Configuration of Transport Mechanism

Figure 6:
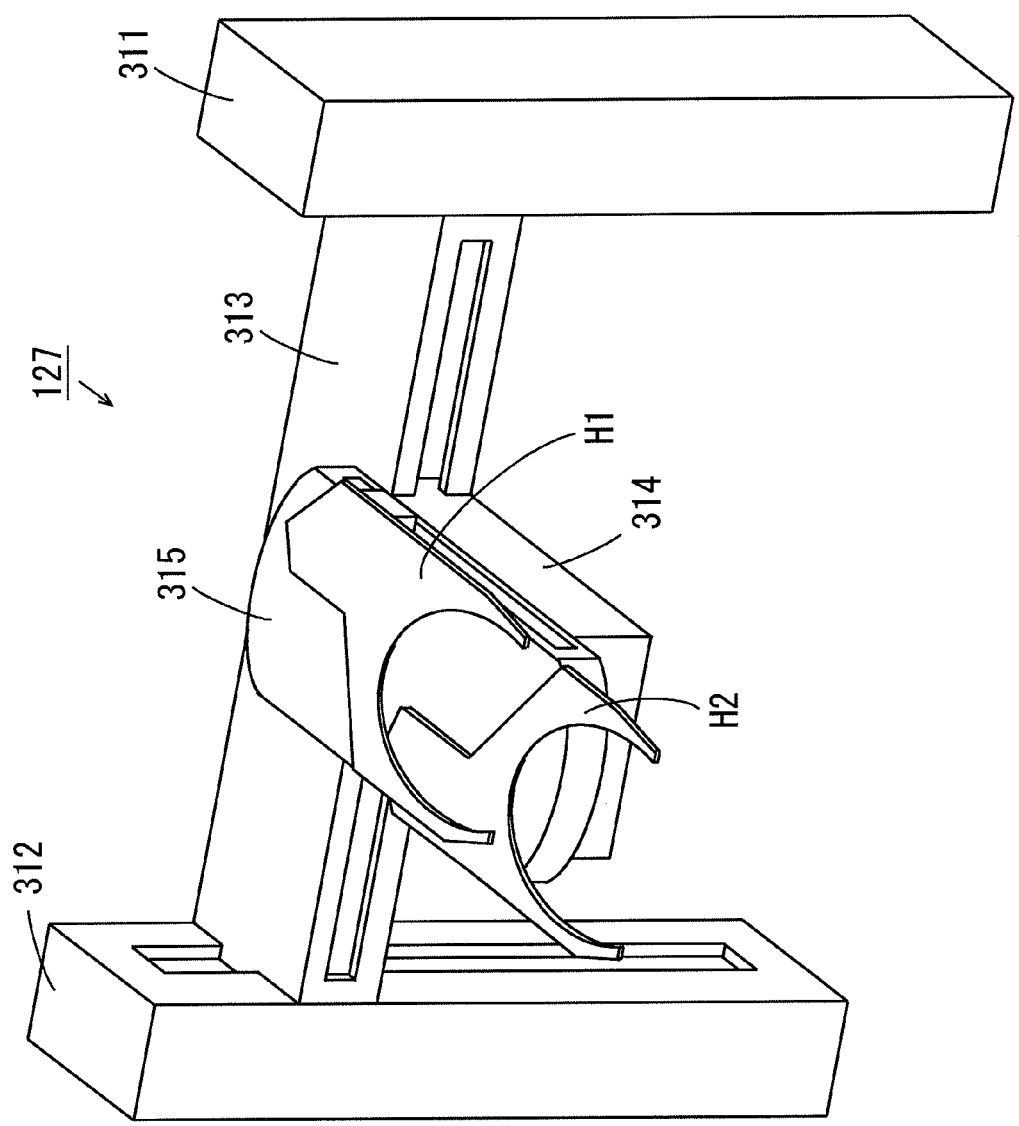
FIG. 6 is a perspective view showing a transport mechanism.

Next, the transport mechanism 127 will be described. FIG. 6 is a perspective view showing the transport mechanism 127.

As shown in FIGS. 5 and 6, the transport mechanism 127 includes long-sized guide rails 311, 312. As shown in FIG. 5, the guide rail 311 is fixed to extend in the vertical direction in the upper transport chamber 125 to be adjacent to the transport section 112. The guide rail 312 is fixed to extend in the vertical direction in the upper transport chamber 125 to be adjacent to the upper transport chamber 135.

As shown in FIGS. 5 and 6, a long-sized guide rail 313 is provided between the guide rail 311 and the guide rail 312. The guide rail 313 is attached to the guide rails 311, 312 to be movable in the vertical direction. A moving member 314 is attached to the guide rail 313. The moving member 314 is provided to be movable in the longitudinal direction of the guide rail 313.

A long-sized rotation member 315 is provided at the upper surface of the moving member 314 to be rotatable. A hand H1 and a hand H2 for holding the substrates W are attached to the rotation member 315. The hands H1, H2 are provided to be movable in the longitudinal direction of the rotation member 315. The hands H1, H2 are configured to be capable of holding the back surfaces of the substrates W by suction without coming into contact with the edges of the substrates W. Details of the hands H1, H2 will be described below.

The aforementioned configuration enables the transport mechanism 127 to freely move in the X and Z directions in the upper transport chamber 125. Further, the transport mechanism 127 can receive and transfer the substrates W to/from the coating processing chambers 21, 22 (FIG. 2), the substrate platforms PASS1, PASS2, PASS5, PASS6 (FIG. 5) and the upper thermal processing section 301 (FIG. 3) using the hands H1, H2.

The transport mechanisms 128, 137, 138 have the similar configuration to the transport mechanism 127 as shown in FIG. 5.

(5) Configuration of Cleaning/Drying Processing Block

Figure 7:
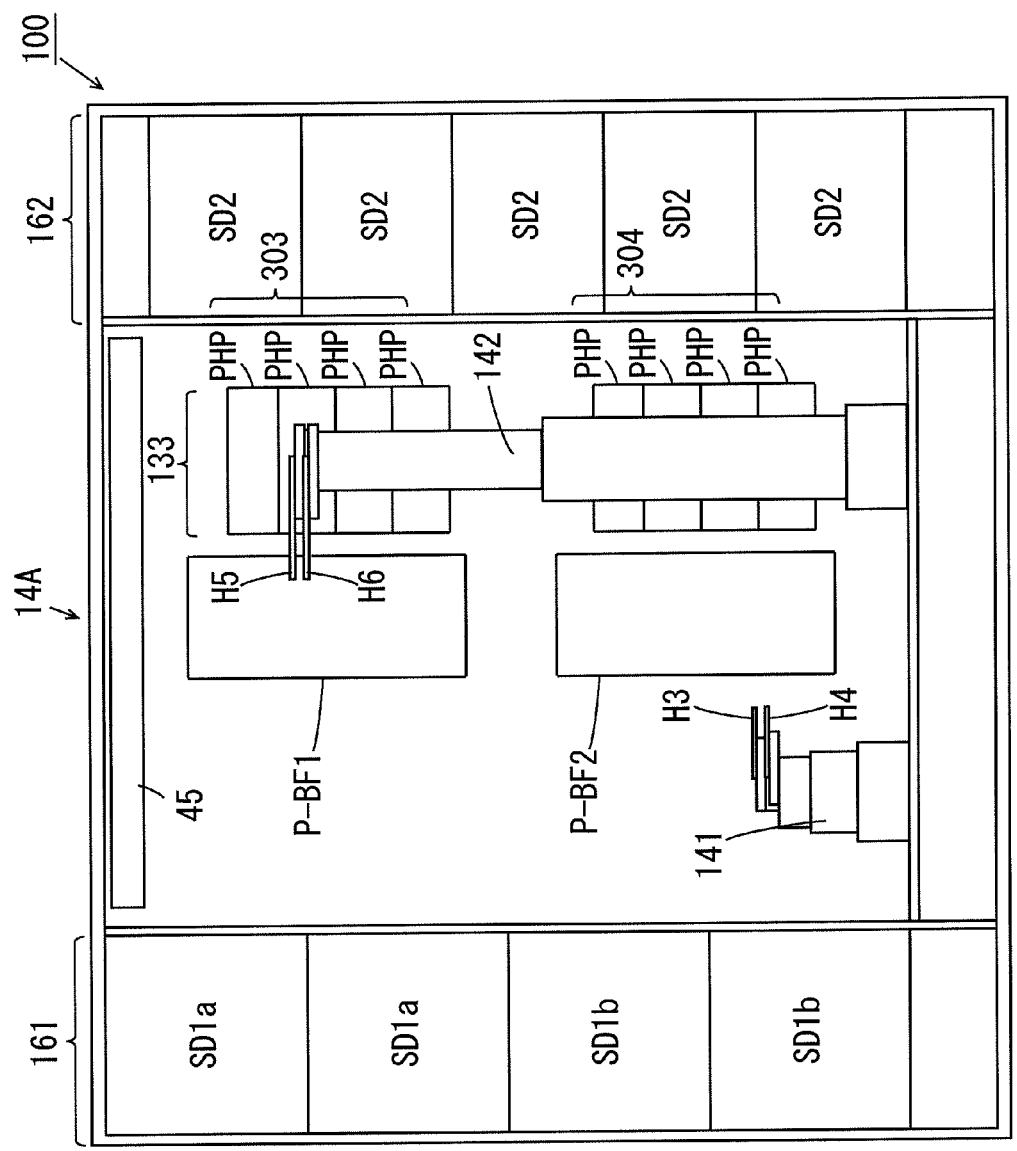
FIG. 7 is a diagram showing the inner configuration of a cleaning/drying processing block.

FIG. 7 is a diagram showing the inner configuration of the cleaning/drying processing block 14A. FIG. 7 is a diagram of the cleaning/drying processing block 14A viewed from the exposure device 15 of FIG. 1.

As shown in FIG. 7, the transport mechanism 141 has hands H3, H4 for holding the substrates W, and the transport mechanism 142 has hands H5, H6 for holding the substrates W. The hands H3 to H6 are configured to be capable of holding the back surfaces of the substrates W by suction without coming into contact with the edges of the substrates W. Details of the hands H3 to H6 will be described below.

The plurality of cleaning/drying processing units SD1a and the plurality of back surface cleaning units SD1b are provided in a stack on the +Y side of the transport mechanism 141, and the plurality of cleaning/drying processing units SD2 are provided in a stack on the −Y side of the transport mechanism 142. The placement/buffer sections P-BF1, P-BF2 are provided one above the other on the −X side between the transport mechanisms 141, 142.

Further, the thermal processing units PHP in the upper thermal processing section 303 and the lower thermal processing section 304 are configured to be capable of carrying in the substrates W from the cleaning/drying processing block 14A.

(6) Operation of Each Constituent Element of Substrate Processing Apparatus

The operation of each constituent element of the substrate processing apparatus 100 according to the present embodiment will be described below.

(6-1) Operation of Indexer Block 11

The operation of the indexer block 11 will be described below mainly using FIGS. 1 and 5.

In the substrate processing apparatus 100 according to the present embodiment, the carrier 113 in which the unprocessed substrates W are stored is placed on the carrier platform 111 in the indexer block 11. The transport mechanism 115 takes out the one substrate W from the carrier 113, and transports the substrate W to the substrate platform PASS1. Thereafter, the transport mechanism 115 takes out another unprocessed substrate W from the carrier 113, and transports the substrate W to the substrate platform PASS3 (FIG. 5).

When the processed substrate W is placed on the substrate platform PASS2 (FIG. 5), the transport mechanism 115 takes out the processed substrate W from the substrate platform PASS2 after transporting the unprocessed substrate W to the substrate platform PASS1. Then, the transport mechanism 115 transports the processed substrate W to the carrier 113. Similarly, when the processed substrate W is placed on the substrate platform PASS4, the transport mechanism 115 takes out the processed substrate W from the substrate platform PASS4 after transporting the unprocessed substrate W to the substrate platform PASS3. Then, the transport mechanism 115 transports the processed substrate W to the carrier 113 and stores the substrate W in the carrier 113.

(6-2) Operation of First Processing Block 12

The operation of the first processing block 12 will be described below mainly using FIGS. 1 to 3 and FIG. 5. Description of the movement of the transport mechanisms 127, 128 in the X direction and the Z direction will not be made for simplification.

The substrate W placed on the substrate platform PASS1 (FIG. 5) by the transport mechanism 115 (FIG. 5) is taken out by the hand H1 of the transport mechanism 127 (FIG. 5). Further, the transport mechanism 127 places the substrate W held by the hand H2 on the substrate platform PASS2. The substrate W placed on the substrate platform PASS2 by the hand H2 is the substrate W after the development processing.

Next, the transport mechanism 127 takes out the substrate W after the adhesion reinforcement processing from a predetermined adhesion reinforcement processing unit PAHP (FIG. 3) in the upper thermal processing section 301 (FIG. 3) using the hand H2. Further, the transport mechanism 127 carries in the unprocessed substrate W held by the hand H1 to the adhesion reinforcement processing unit PAHP.

Then, the transport mechanism 127 takes out the substrate W after the cooling processing from a predetermined cooling unit CP in the upper thermal processing section 301 (FIG. 3) using the hand H1. Further, the transport mechanism 127 carries in the substrate W after the adhesion reinforcement processing held by the hand H2 to the cooling unit CP. In the cooling unit CP, the substrate W is cooled to a temperature suitable for anti-reflection film formation.

Then, the transport mechanism 127 takes out the substrate W after the anti-reflection film formation placed on the spin chuck 25 (FIG. 2) in the coating processing chamber 22 (FIG. 2) using the hand H2. Further, the transport mechanism 127 places the substrate W after the cooling processing held by the hand H1 on the spin chuck 25. In the coating processing chamber 22, an anti-reflection film is formed on the substrate W by the coating processing unit 129 (FIG. 2).

Next, the transport mechanism 127 takes out the substrate W after the thermal processing from a predetermined thermal processing unit PHP in the upper thermal processing section 301 (FIG. 3) using the hand H1. Further, the transport mechanism 127 carries in the substrate W after the anti-reflection film formation held by the hand H2 to the thermal processing unit PHP. In the thermal processing unit PHP, the heating processing and the cooling processing for the substrate W are successively performed.

Next, the transport mechanism 127 takes out the substrate W after the cooling processing from a predetermined cooling unit CP (FIG. 3) in the upper thermal processing section 301 (FIG. 4) using the hand H2. Further, the transport mechanism 127 carries in the substrate W after the thermal processing held by the hand H1 to the cooling unit CP. In the cooling unit CP, the substrate W is cooled to a temperature suitable for resist film formation processing.

Then, the transport mechanism 127 takes out the substrate W after the resist film formation from the spin chuck 25 (FIG. 2) in the coating processing chamber 21 (FIG. 2) using the hand H1. Further, the transport mechanism 127 places the substrate W after the cooling processing held by the hand H2 on the spin chuck 25. In the coating processing chamber 22, the resist film is formed on the substrate W by the coating processing unit 129 (FIG. 2).

Next, the transport mechanism 127 takes out the substrate W after the thermal processing from a predetermined thermal processing unit PHP in the upper thermal processing section 301 (FIG. 3) using the hand H2. Further, the transport mechanism 127 carries in the substrate W after the resist film formation held by the hand H1 to the thermal processing unit PHP.

Then, the transport mechanism 127 places the substrate W after the thermal processing held by the hand H2 on the substrate platform PASS5 (FIG. 5). Further, the transport mechanism 127 takes out the substrate W after the development processing from the substrate platform PASS6 (FIG. 5) using the hand H2. Thereafter, the transport mechanism 127 transports the substrate W after the development processing that has been taken out from the substrate platform PASS6 to the substrate platform PASS2 (FIG. 5). The transport mechanism 127 repeats the processing described above such that the plurality of substrates W are successively subjected to the predetermined processing in the first processing block 12.

The transport mechanism 128 carries in and carries out the substrates W to/from the substrate platforms PASS3, PASS4, PASS7, PASS8 (FIG. 5), the coating processing chambers 23, 24 (FIG. 2) and the lower thermal processing section 302 (FIG. 4) by the operation similar to the transport mechanism 127.

In this manner, in the present embodiment, the substrates W transported by the transport mechanism 127 are processed in the coating processing chambers 21, 22 and the upper thermal processing section 301, and the substrates W transported by the transport mechanism 128 are processed in the coating processing chambers 23, 24 and the lower thermal processing section 302. In this case, the processing for the plurality of substrates W can be simultaneously performed in the upper processing section (the coating processing chambers 21, 22 and the upper thermal processing section 301) and the lower processing section (the coating processing chambers 23, 24 and the lower thermal processing section 302). Throughput of the first processing block 12 can be improved without an increase in the transport speed of the substrates W by the transport mechanisms 127, 128. Further, the transport mechanisms 127, 128 are provided one above the other, so that an increase in the footprint of the substrate processing apparatus 100 can be prevented.

While the cooling processing for the substrate W is performed in the cooling unit CP before the anti-reflection film formation processing in the coating processing chamber 22 in the example described above, the cooling processing for the substrate W does not have to be performed in the cooling unit CP before the anti-reflection film formation processing if an anti-reflection film can be appropriately formed.

(6-3) Operation of Second Processing Block 13

The operation of the second processing block 13 will be described mainly using FIGS. 1 to 3 and FIG. 5. In the following description, description will not be made of the movement of the transport mechanisms 137, 138 in the X direction and the Z direction for simplification.

The substrate W placed on the substrate platform PASS5 (FIG. 5) by the transport mechanism 127 is taken out by the hand H1 of the transport mechanism 137 (FIG. 5). Further, the transport mechanism 137 places the substrate W held by the hand H2 on the substrate platform PASS6. The substrate W placed on the substrate platform PASS6 from the hand H2 is the substrate W after the development processing.

Next, the transport mechanism 137 takes out the substrate W after resist cover film formation from the spin chuck 25 (FIG. 2) in the coating processing chamber 32 (FIG. 2) using the hand H2. Further, the transport mechanism 137 places the substrate W after the resist film formation held by the hand H1 on the spin chuck 25. In the coating processing chamber 32, a resist cover film is formed on the substrate W by the coating processing unit 129 (FIG. 2).

Then, the transport mechanism 137 takes out the substrate W after the thermal processing from a predetermined thermal processing unit PHP in the upper thermal processing section 303 (FIG. 3) using the hand H1. Further, the transport mechanism 137 carries in the substrate W after the resist cover film formation held by the hand H2 to the thermal processing unit PHP.

Next, the transport mechanism 137 takes out the substrate W after the edge exposure processing from the edge exposure unit EEW (FIG. 3) using the hand H2. Further, the transport mechanism 137 carries in the substrate W after the thermal processing held by the hand H1 to the edge exposure unit EEW. The edge exposure processing for the substrate W is performed in the edge exposure unit EEW as described above.

The transport mechanism 137 places the substrate W after the edge exposure processing held by the hand H2 on the placement/buffer section P-BF1 (FIG. 5) and takes out the substrate W after the thermal processing from the thermal processing unit PHP adjacent to the carry-in/carry-out block 14A in the upper thermal processing section 301 (FIG. 4) using the hand H2. The substrate W taken out from the thermal processing unit PHP adjacent to the carry-in/carry-out block 14A is the substrate Won which the exposure processing in the exposure device 15 has been completed.

Then, the transport mechanism 137 takes out the substrate W after the cooling processing from a predetermined cooling unit CP (FIG. 3) in the upper thermal processing section 303 (FIG. 3) using the hand H1. Further, the transport mechanism 137 carries in the substrate W after the exposure processing held by the hand H2 to the cooling unit CP. In the cooling unit CP, the substrate W is cooled to a temperature suitable for the development processing.

Next, the transport mechanism 137 takes out the substrate W after the development processing from the spin chuck 35 (FIG. 2) in the development processing chamber 31 (FIG. 2) using the hand H2. Further, the transport mechanism 137 places the substrate W after the cooling processing held by the hand H1 on the spin chuck 35. In the development processing chamber 31, removal processing of the resist cover film and the development processing are performed by the development processing unit 139.

Next, the transport mechanism 137 takes out the substrate W after the thermal processing from a predetermined thermal processing unit PHP in the upper thermal processing section 303 (FIG. 4) using the hand H1. Further, the transport mechanism 137 carries in the substrate W after the development processing held by the hand H2 to the thermal processing unit PHP. Thereafter, the transport mechanism 137 places the substrate W that has been taken out from the thermal processing unit PHP on the substrate platform PASS6 (FIG. 5).

The transport mechanism 137 repeats the processing described above such that the plurality of substrates W are successively subjected to the predetermined processing in the second processing block 13.

The transport mechanism 138 carries in and carries out the substrates W to/from the substrate platforms PASS7, PASS8, P-BF2 (FIG. 5), the development processing chamber 33 (FIG. 2), the coating processing chamber 34 (FIG. 2) and the lower thermal processing section 304 (FIG. 3) by the similar operation to the transport mechanism 137.

In this manner, in the present embodiment, the substrates W transported by the transport mechanism 137 are processed in the development processing chamber 31, the coating processing chamber 32 and the upper thermal processing section 303, and the substrates W transported by the transport mechanism 138 are processed in the development processing chamber 33, the coating processing chamber 34 and the lower thermal processing section 304. In this case, the processing for the plurality of substrates W can be simultaneously performed in the upper processing section (the development processing chamber 31, the coating processing chamber 32 and the upper thermal processing section 303) and the lower processing section (the development processing chamber 33, the coating processing chamber 34 and the lower thermal processing section 304). Thus, throughput of the second processing block 13 can be improved without an increase in the transportation speed of the substrates W by the transport mechanisms 137, 138. Further, the transport mechanisms 137, 138 are provided one above the other, so that an increase in the footprint of the substrate processing apparatus 100 can be prevented.

(6-4) Operation of Cleaning/Drying Processing Block 14A and Carry-in/Carry-out Block 14B The operation of the cleaning/drying processing block 14A and the carry-in/carry-out block 14B will be described below mainly using FIGS. 5 and 7.

In the cleaning/drying processing block 14A, the transport mechanism 141 (FIG. 7) takes out the substrate W after the edge exposure placed on the placement/buffer section P-BF1 by the transport mechanism 137 (FIG. 5) using the hand H3.

Next, the transport mechanism 141 takes out the substrate W after the cleaning and drying processing for the main surface from a predetermined cleaning/drying processing unit SD1a in the cleaning/drying processing section 161 (FIG. 7) using the hand H4. Further, the transport mechanism 141 carries in the substrate W after the edge exposure held by the hand H3 to the cleaning/drying processing unit SD1a.

Then, the transport mechanism 141 takes out the substrate W after the cleaning processing for the back surface from a predetermined back surface cleaning processing unit SD1b in the cleaning/drying processing unit 161 (FIG. 7) using the hand H3. Further, the transport mechanism 141 carries in the substrate W after the cleaning and drying processing for the main surface held by the hand H4 to the back surface cleaning processing unit SD1b.

Then, the transport mechanism 141 places the substrate W after the cleaning and drying processing for the main surface and the cleaning processing for the back surface held by the hand H3 on a placement/cooling platform P-CP (FIG. 5). In the placement/cooling platform P-CP, the substrate W is cooled to a temperature suitable for the exposure processing in the exposure device 15 (FIG. 1).

Next, the transport mechanism 141 takes out the substrate W after the edge exposure placed on the placement/buffer section P-BF2 by the transport mechanism 138 (FIG. 5) using the hand H3.

Then, the transport mechanism 141 takes out the substrate W after the cleaning and drying processing for the main surface from a predetermined cleaning/drying processing unit SD1a in the cleaning/drying processing section 161 (FIG. 7) using the hand H4. Further, the transport mechanism 141 carries in the substrate W after the edge exposure held by the hand H3 to the cleaning/drying processing unit SD1a.

Next, the transport mechanism 141 takes out the substrate W after the cleaning processing for the back surface from a predetermined back surface cleaning processing unit SD1b in the cleaning/drying processing section 161 (FIG. 7) using the hand H3. Further, the transport mechanism 141 carries in the substrate W after the cleaning and drying processing for the main surface held by the hand H4 to the back surface cleaning processing unit SD1b.

Then, the transport mechanism 141 places the substrate W after the cleaning and drying processing for the main surface and the cleaning processing for the back surface held by the hand H3 on a placement/cooling platform P-CP (FIG. 5).

In this manner, the transport mechanism 141 alternately takes out the substrates W after the edge exposure from the placement/buffer units P-BF1, P-BF2, and transports the substrates W to placement/cooling platforms P-CP via the cleaning/drying processing section 161.

Here, the substrates W stored in the carrier 113 (FIG. 5) are alternately transported to the substrate platforms PASS1, PASS3 (FIG. 5) by the transport mechanism 115 (FIG. 5). Further, a processing speed of the substrates W in the coating processing chambers 21, 22 (FIG. 2) and the upper thermal processing section 301 (FIG. 3) and a processing speed of the substrates W in the coating processing chambers 23, 24 (FIG. 2) and the lower thermal processing section 302 (FIG. 3) are substantially the same.

Further, an operation speed of the transport mechanism 127 (FIG. 5) and an operation speed of the transport mechanism 128 (FIG. 5) are substantially the same. Further, a processing speed of the substrates W in the development processing chamber 31 (FIG. 2), the coating processing chamber 32 and the upper thermal processing section 303 (FIG. 3), and a processing speed of the substrates W in the development processing chamber 33 (FIG. 2), the coating processing chamber 34 and the lower thermal processing section 304 (FIG. 3) are substantially the same. Further, an operation speed of the transport mechanism 137 (FIG. 5) and an operation speed of the transport mechanism 138 (FIG. 5) are substantially the same.

Therefore, the substrates W are alternately transported from the placement/buffer sections P-BF1, P-BF2 (FIG. 5) to the placement/cooling platforms P-CP by the transport mechanism 141 (FIG. 7) as described above, whereby the order in which the substrates W are carried in from the carrier 113 to the substrate processing apparatus 100 and the order in which the substrates W are transported from the cleaning/drying processing block 14A to a placement/cooling platform P-CP (FIG. 5) match each other. In this case, a processing history of each substrate W in the substrate processing apparatus 100 is easily managed.

The transport mechanism 142 (FIG. 7) takes out the substrate W after the exposure processing placed on the substrate platform PASS9 (FIG. 5) using the hand H5. Next, the transport mechanism 142 takes out the substrate W after the cleaning and drying processing from a predetermined cleaning/drying processing unit SD2 in the cleaning/drying processing section 162 (FIG. 7) using the hand H6. Further, the transport mechanism 142 carries in the substrate W after the exposure processing held by the hand H5 to the cleaning/drying processing unit SD2.

Then, the transport mechanism 142 transports the substrate W after the cleaning and drying processing held by the hand H6 to a thermal processing unit PHP (FIG. 7) in the upper thermal processing section 303. In this thermal processing unit PHP, post-exposure bake (PEB) processing is performed.

Next, the transport mechanism 142 (FIG. 7) takes out the substrate W after the exposure processing placed on the substrate platform PASS9 (FIG. 5) using the hand H5. Next, the transport mechanism 142 takes out the substrate W after the cleaning and drying processing from a predetermined cleaning/drying processing unit SD2 in the cleaning/drying processing section 162 (FIG. 7) using the hand H6. Further, the transport mechanism 142 carries in the substrate W after the exposure processing held by the hand H5 to the cleaning/drying processing unit SD2.

Then, the transport mechanism 142 transports the substrate W after the cleaning/drying processing held by the hand H6 to a thermal processing unit PHP (FIG. 7) in the lower thermal processing section 304. In this thermal processing unit PHP, the PEB processing is performed.

In this manner, the transport mechanism 142 alternately transports the substrates W after the exposure processing placed on the substrate platform PASS9 to the upper thermal processing section 303 and the lower thermal processing section 304 via the cleaning/drying processing section 162.

In the carry-in/carry-out block 14B, the transport mechanism 146 (FIG. 5) takes out the substrate W placed on a placement/cooling platform P-CP and transports the same to the substrate inlet 15a of the exposure device 15 using the hand H7. Further, the transport mechanism 146 takes out the substrate W after the exposure processing from the substrate outlet 15b of the exposure device 15, and transports the same to the substrate platform PASS9 using the hand H8.

When the exposure device 15 cannot receive the substrates W, the substrates W after the cleaning and drying processing are temporarily stored in the placement/buffer sections P-BF1, P-BF2 by the transport mechanism 141 (FIG. 7).

Further, when the development processing unit 139 (FIG. 2) in the second processing block 13 cannot receive the substrate W after the exposure processing, the substrates W after the PEB processing are temporarily stored in the placement/buffer sections P-BF1, P-BF2 by the transport mechanisms 137, 138 (FIG. 5).

Further, when the substrates W are not normally transported to the placement/buffer sections P-BF1, P-BF2 due to malfunction and the like of the first and second processing blocks 12, 13, the transportation of the substrates W from the placement/buffer sections P-BF1, P-BF2 by the transport mechanism 141 may be temporarily stopped until the transportation of the substrates W is normalized.

(7) Configuration of Hands

The hand 116 of the transport mechanism 115 of FIG. 1, the hands H3, H4 of the transport mechanism 141 of FIG. 7, the hands H5, H6 of the transport mechanism 142 of FIG. 7 and the hands H7, H8 of the transport mechanism 146 of FIG. 5 have the same configuration.

Figure 8:
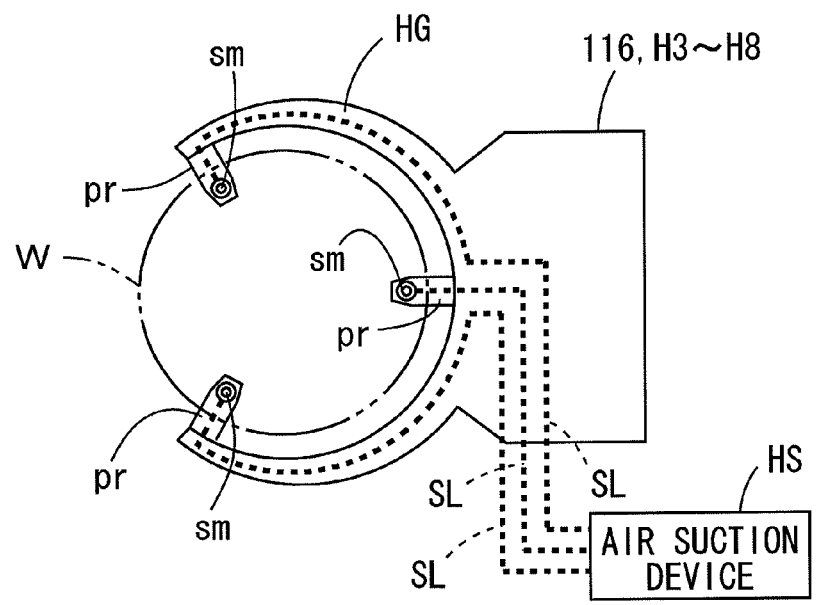
FIG. 8 is a schematic plan view showing the configuration of hands of FIGS. 1, 5 and 7.

FIG. 8 is a schematic plan view showing the configuration of the hands 116, H3 to H8 of FIGS. 1, 5 and 7. As shown in FIG. 8, each of the hands 116, H3 to H8 has a substantially C-shaped guide HG in which the front is opened. A plurality (three in this example) of support pieces pr are provided to respectively extend inward of the guide HG at equal angular intervals with respect to the center of the circle formed along the inner periphery of the guide HG. A suction portion sm is provided at the tip end of each support piece pr. One end of a tube SL made of resin is connected to each suction portion sm. The other end of each tube SL is connected to an air suction device HS.

In each of the hands 116, H3 to H8, the substrate W is placed on the three suction portions sm. In this state, the air suction device HS operates such that three portions on the back surface of the substrate W positioned over the three suction portions sm are respectively sucked by the three suction portions sm. In this manner, the back surface of the substrate W is held by suction. In this state, the substrate W is transported. In FIG. 8, the substrate W held by the hands 116, H3 to H8 is indicated by the two-dot and dash line.

Figure 9:
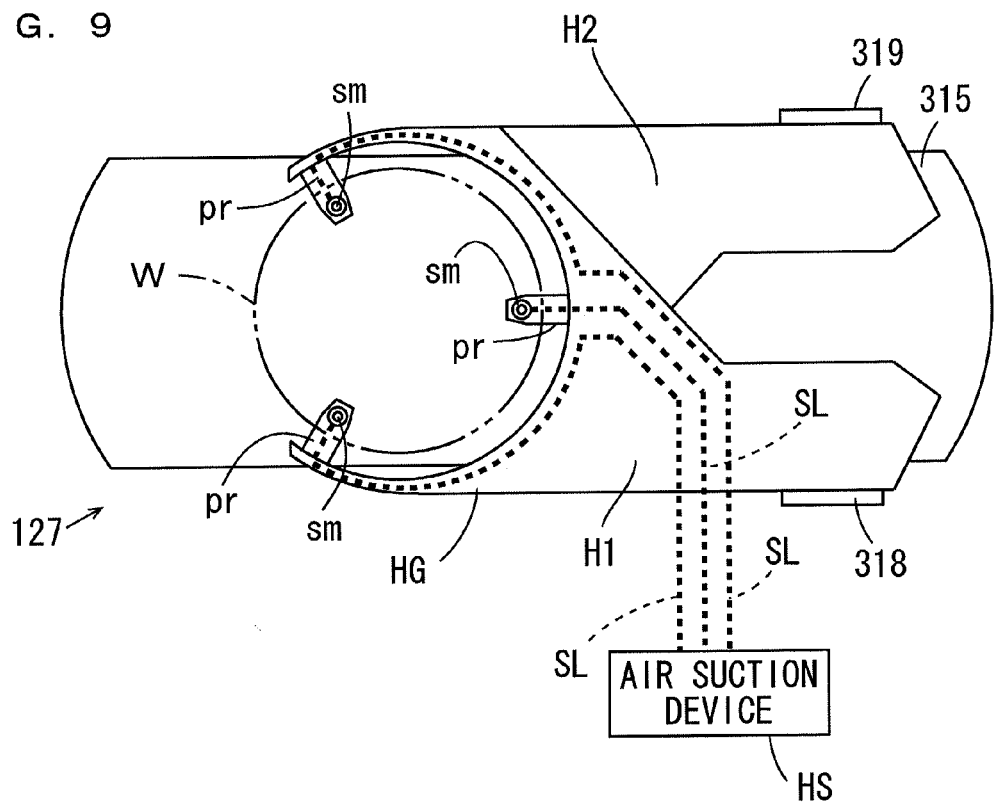
FIG. 9 is a schematic plan view showing the configuration of the hand of FIG. 6.

FIG. 9 is a schematic plan view showing the configuration of the hands H1, H2 of FIG. 6. As shown in FIG. 9, the hand H1 has the substantially C-shaped guide HG in which the front is opened. The plurality (three in this example) of support pieces pr are formed inward of the guide HG at equal angular intervals with respect to the center of the circle formed along the inner periphery of the guide HG. The suction portion sm is provided at the tip end of each support piece pr. One end of the tube SL made of resin is connected to each suction portion sm. The other end of each tube SL is connected to the air suction device HS. The hand H1 is attached to one side portion of the rotation member 315 by a hand support member 318. In this state, the hand H1 can be moved in the longitudinal direction of the rotation member 315.

The hand H2 has the same configuration as the hand H1. The hand H2 is attached to another side portion of the rotation member 315 by a hand support member 319 while being reversed with an axis parallel to the longitudinal direction of the rotation member 315 as a center with respect to the hand H1.

In each of the hands H1, H2, similarly to the examples of the hands 116, H3 to H8 described above, the air intake suction HS operates such that the back surface of the substrate W is held by suction. In FIG. 9, the substrate W held by the hand H1 is indicated by the two-dot and dash line.

As described above, in the substrate processing apparatus 100 according to the present embodiment, each of the hands 116, H1 to H8 of the transport mechanisms 115, 127, 128, 137, 138, 141, 142, 146 can hold the back surface of the substrate W by suction without coming into contact with the edge of the substrate W.

(8) Substrate Suction Sheet 220 and Temperature Processing Device 250

Figure 10:
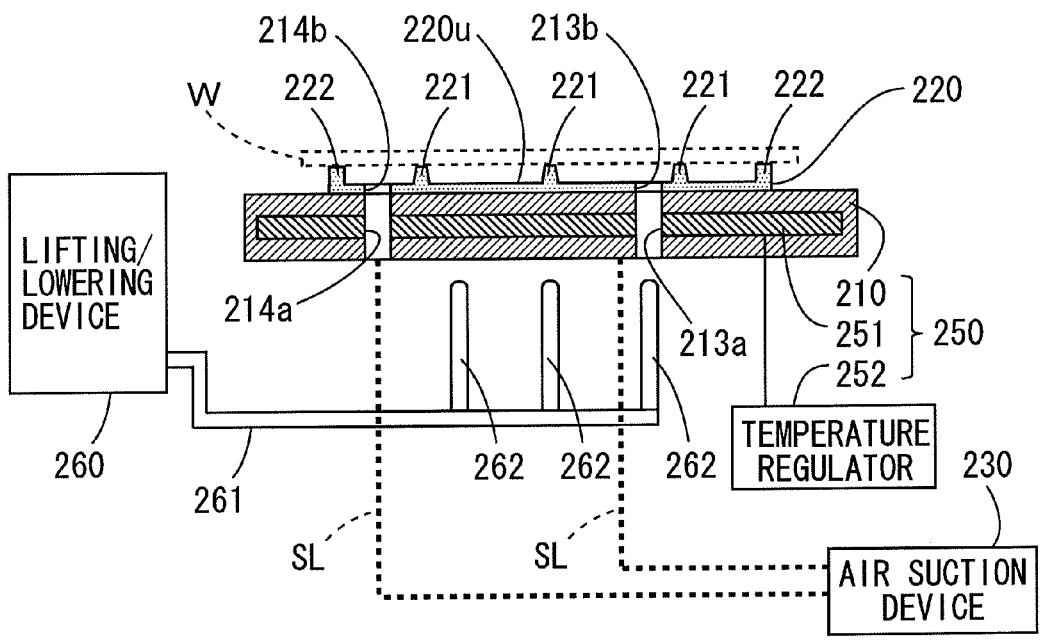
FIG. 10 is a schematic diagram for explaining a substrate suction sheet and a temperature processing device included in each of a adhesion reinforcement processing unit and a cooling unit of FIG. 3.

FIG. 10 is a schematic diagram for explaining a substrate suction sheet 220 and a temperature processing device 250 included in each of the adhesion reinforcement processing units PAHP and the cooling units CP of FIG. 3.

As shown in FIG. 10, the temperature processing device 250 includes a substrate placement plate 210, a temperature regulating body 251, a temperature regulator 252. In FIG. 10, the substrate placement plate 210 is shown in a vertical cross sectional view.

Figure 11:
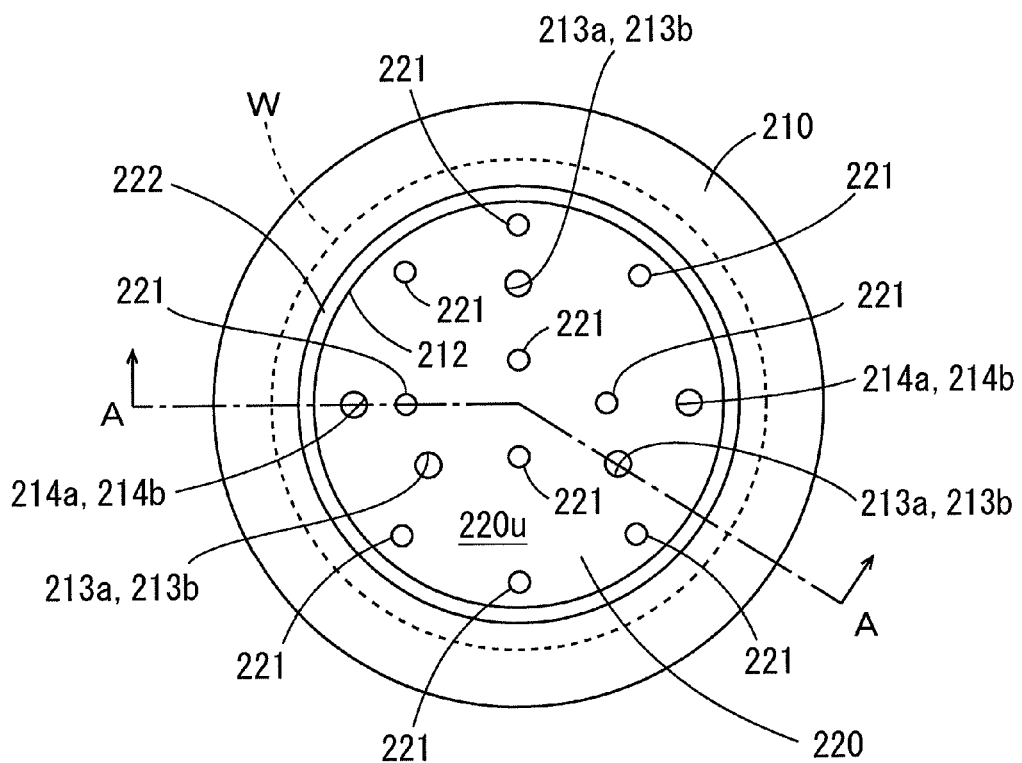
FIG. 11 is a plan view of a substrate placement plate of FIG. 10.

FIG. 11 is a plan view of the substrate placement plate 210 of FIG. 10. The vertical cross sectional view of the substrate placement plate 210 shown in FIG. 10 corresponds to the vertical cross sectional view of the substrate placement plate 210 taken along the line A-A of FIG. 11.

As shown in FIGS. 10 and 11, the substrate placement plate 210 has a circular upper surface. The upper surface of the substrate placement plate 210 has a diameter larger than the diameter of the substrate W. The circular substrate suction sheet 220 is attached to the central portion on the upper surface of the substrate placement plate 210. The substrate suction sheet 220 is formed of resin, for example. The diameter of the substrate suction sheet 220 is smaller than that of the substrate W.

A plurality (three in this example) of support pin insertion holes 213a and a plurality (two in this example) of gas-suction holes 214a are formed at the substrate placement plate 210. A plurality (three in this example) of support pin insertion holes 213b and a plurality (two in this example) of gas-suction holes 214b are formed at the substrate suction sheet 220.

The substrate suction sheet 220 is attached to the upper surface of the substrate placement plate 210 such that positions of the plurality of support pin insertion holes 213a and the plurality of gas-suction holes 214a of the substrate placement plate 210, and positions of the plurality of support pin insertion holes 213b and the plurality of gas-suction holes 214b of the substrate suction sheet 220 match each other.

A plurality (ten in this example) of projections 221 and a seal projection 222 are formed to project upward from the upper surface 220u of the substrate suction sheet 220. The seal projection 222 is formed to extend along the outer periphery of the substrate suction sheet 220. The plurality of projections 221 are formed to disperse in the region inside the seal projection 222. The plurality of projections 221 and the seal projection 222 have the same height.

One end of the tube SL is connected to the forming portion of each gas-suction hole 214a on the lower surface of the substrate placement plate 210. The other end of each tube SL is connected to an air suction device 230.

The temperature regulating body 251 is provided inside the substrate placement plate 210. In the adhesion reinforcement processing unit PAHP of FIG. 3, the temperature regulating body 251 is a heating element such as a mica heater. On the other hand, in the cooling unit CP of FIG. 3, the temperature regulating body 251 is a cooling body such as a peltier element. A temperature of the temperature regulating body 251 is regulated by the temperature regulator 252. The temperature regulator 252 is controlled by the controller 114 of FIG. 1, for example. In the cooling unit CP of FIG. 3, a circulation flow path of cooling water may be provided inside the substrate placement plate 210 instead of the temperature regulating body 251. In this case, cooling water is supplied to the circulation flow path such that the temperature of the substrate placement plate 210 can be regulated to a predetermined temperature.

As shown in FIG. 10, a lifting/lowering device 260 is provided in each of the adhesion reinforcement processing units PAHP and each of the cooling units CP of FIG. 3 together with the substrate suction sheet 220 and the temperature processing device 250. A coupling member 261 is attached to the lifting/lowering device 260 to be movable in the vertical direction. The coupling member 261 attached to the lifting/lowering device 260 is arranged below the substrate placement plate 210.

A plurality (three in this example) of support pins 262 are attached to the coupling member 261 to respectively extend in the vertical direction. Each support pin 262 is a bar-shaped member having a circular cross section.

The diameter of each of the plurality of support pins 262 is smaller than the inner diameter of the plurality of support pin insertion holes 213a, 213b. The plurality of support pins 262 are arranged to be insertable into the plurality of support pin insertion holes 213a, 213b by moving in the vertical direction, respectively.

The lifting/lowering device 260 is controlled by the controller 114 of FIG. 1, for example. The lifting/lowering device 260 operates such that the coupling member 261 is moved in the vertical direction. Thus, the upper ends of the plurality of support pins 262 are moved between a position above the substrate placement plate 210 and a position below the upper surface of the substrate placement plate 210 through the plurality of support pin insertion holes 213a, 213b, respectively.

In the temperature processing device 250 of FIGS. 10 and 11, temperature processing for the substrate W is performed as described below.

First, the lifting/lowering device 260 lifts the coupling member 261. Thus, each of the upper ends of the plurality of support pins 262 are moved to the position above the substrate placement plate 210. In this state, the substrate W is transferred on the plurality of support pins 262 from a transport mechanism (not shown).

Next, the lifting/lowering device 260 lowers the coupling member 261 such that the upper ends of the plurality of support pins 262 are moved to the position below the upper surface of the substrate placement plate 210. Thus, the back surface of the substrate W abuts against the upper ends of the plurality of projections 221 and the seal projection 222 of the substrate suction sheet 220, and the back surface of the substrate W is supported by the substrate suction sheet 220. In this case, because the diameter of the substrate suction sheet 220 is smaller than that of the substrate W, the edge of the substrate W does not come into contact with the substrate suction sheet 220.

Subsequently, the air suction device 230 operates such that an atmosphere in a space between the back surface of the substrate W and the upper surface 220u of the substrate suction sheet 220 is sucked by the air suction device 230 through the gas suction holes 214a, 214b and the tube SL. Thus, negative pressure is developed in the space between the back surface of the substrate W and the upper surface 220u of the substrate suction sheet 220, whereby the back surface of the substrate W is held by suction by the substrate suction sheet 220. In this state, a temperature of the temperature regulating body 251 is regulated such that temperature processing (heating processing or cooling processing) is performed on the substrate W.

Thereafter, the air suction device 230 is stopped, and the lifting/lowering device 260 lifts the coupling member 261. Thus, the substrate W is moved to the position above the substrate placement plate 210 while the back surface of the substrate W is supported by the plurality of support pins 262. The substrate W on the plurality of support pins 262 is received by a transport mechanism (not shown).

As described above, the substrate suction sheet 220 holds the back surface of the substrate W by suction without coming into contact with the edge of the substrate W. Therefore, in the adhesion reinforcement processing unit PAHP and the cooling unit CP of FIG. 3, a member that holds the substrate W or a member that supports the substrate W does not come into contact with the edge of the substrate W. Thus, the temperature processing can be performed on the substrate W while a contaminant is prevented from occurring and being transferred to the edge of the substrate W.

Further, the temperature processing is performed on the substrate W while the back surface of the substrate W is held by suction by the substrate suction sheet 220. In this case, the uniform temperature processing can be performed on the substrate W while the substrate W is prevented from deformation.

(9) Thermal Processing Unit (9-1) Configuration of Thermal Processing Unit

Figure 12:
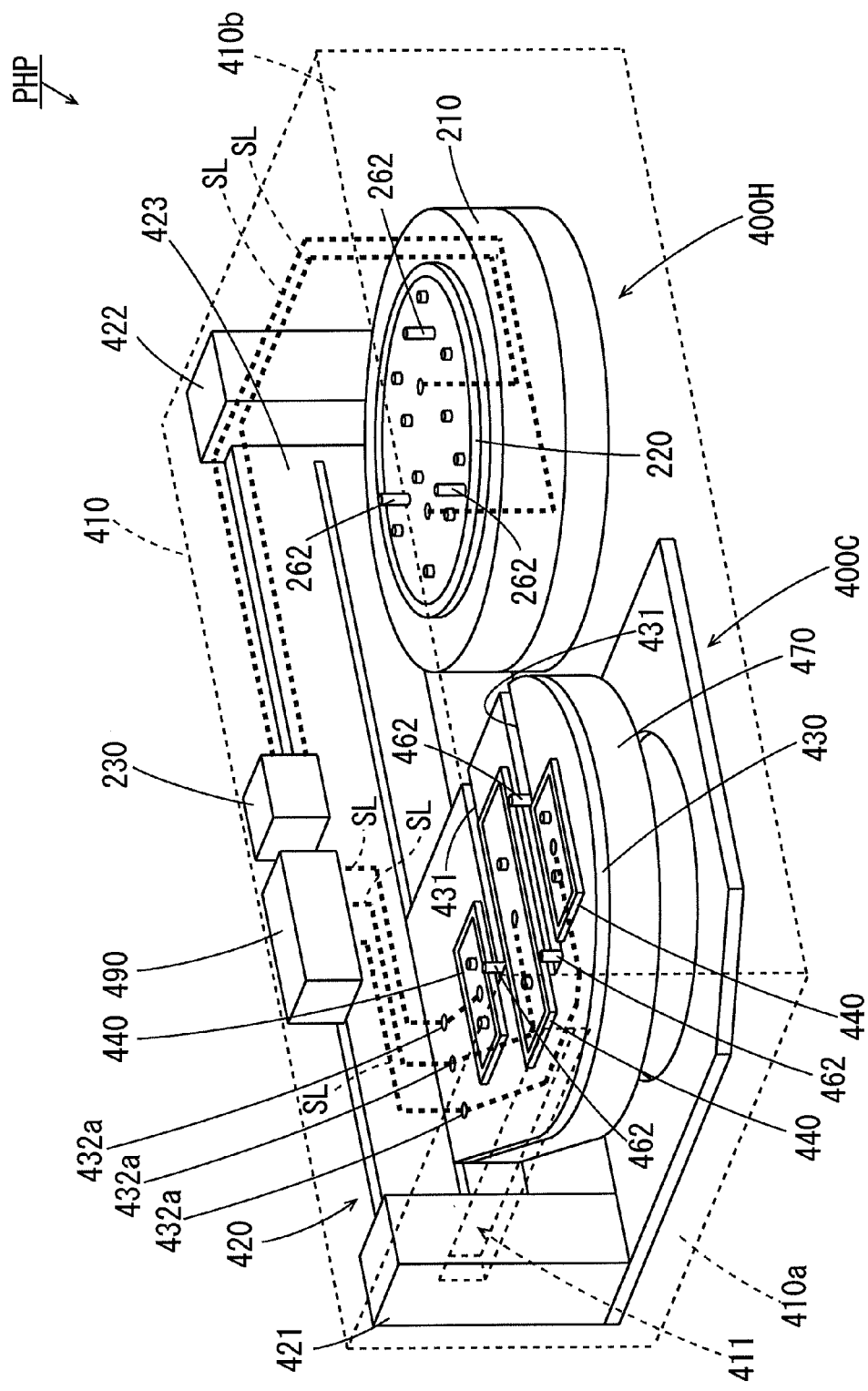
FIG. 12 is a perspective view of the thermal processing unit of FIG. 3.
Figure 13:
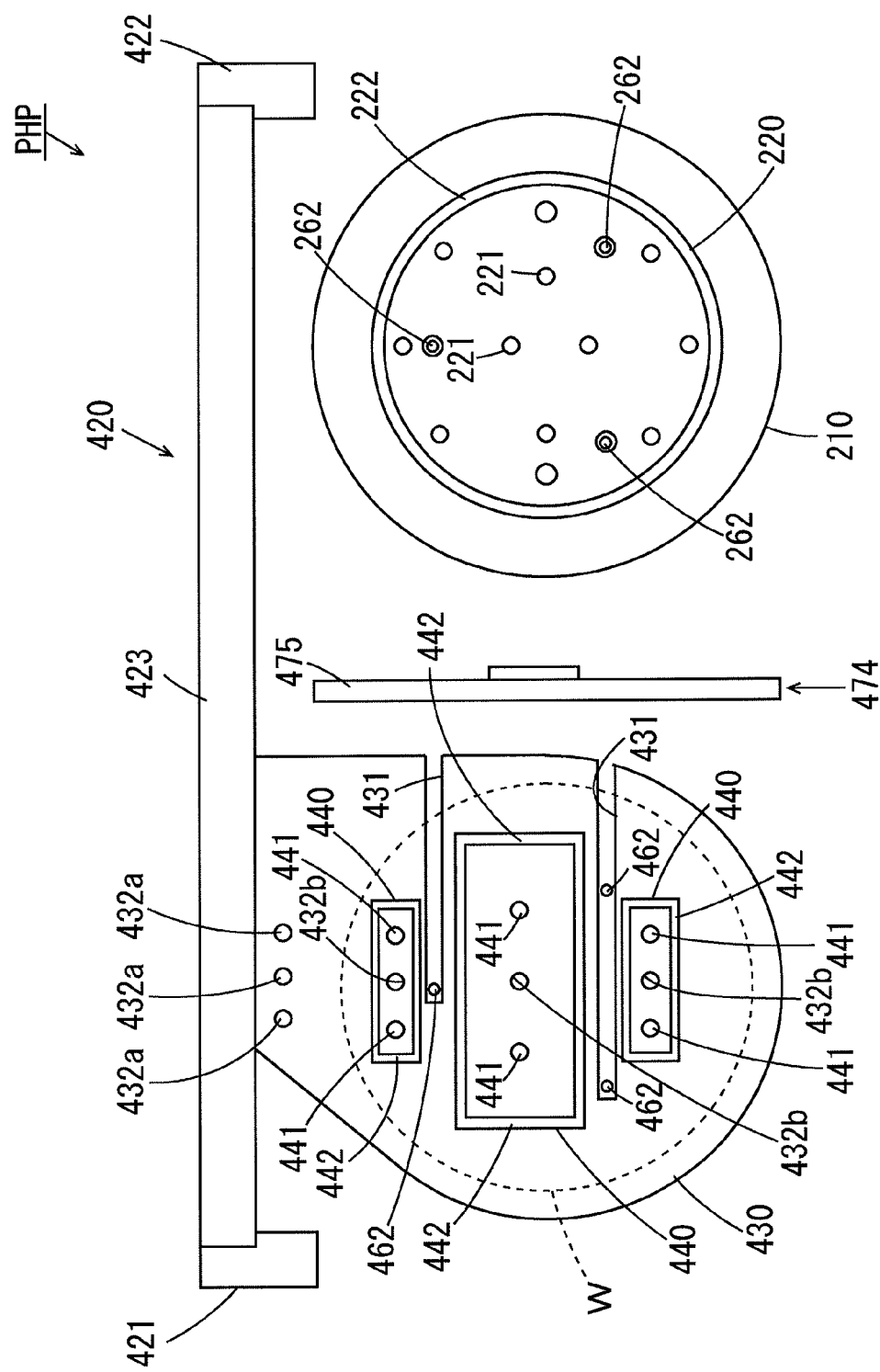
FIG. 13 is a plan view of the thermal processing unit of FIG. 3.
Figure 14:
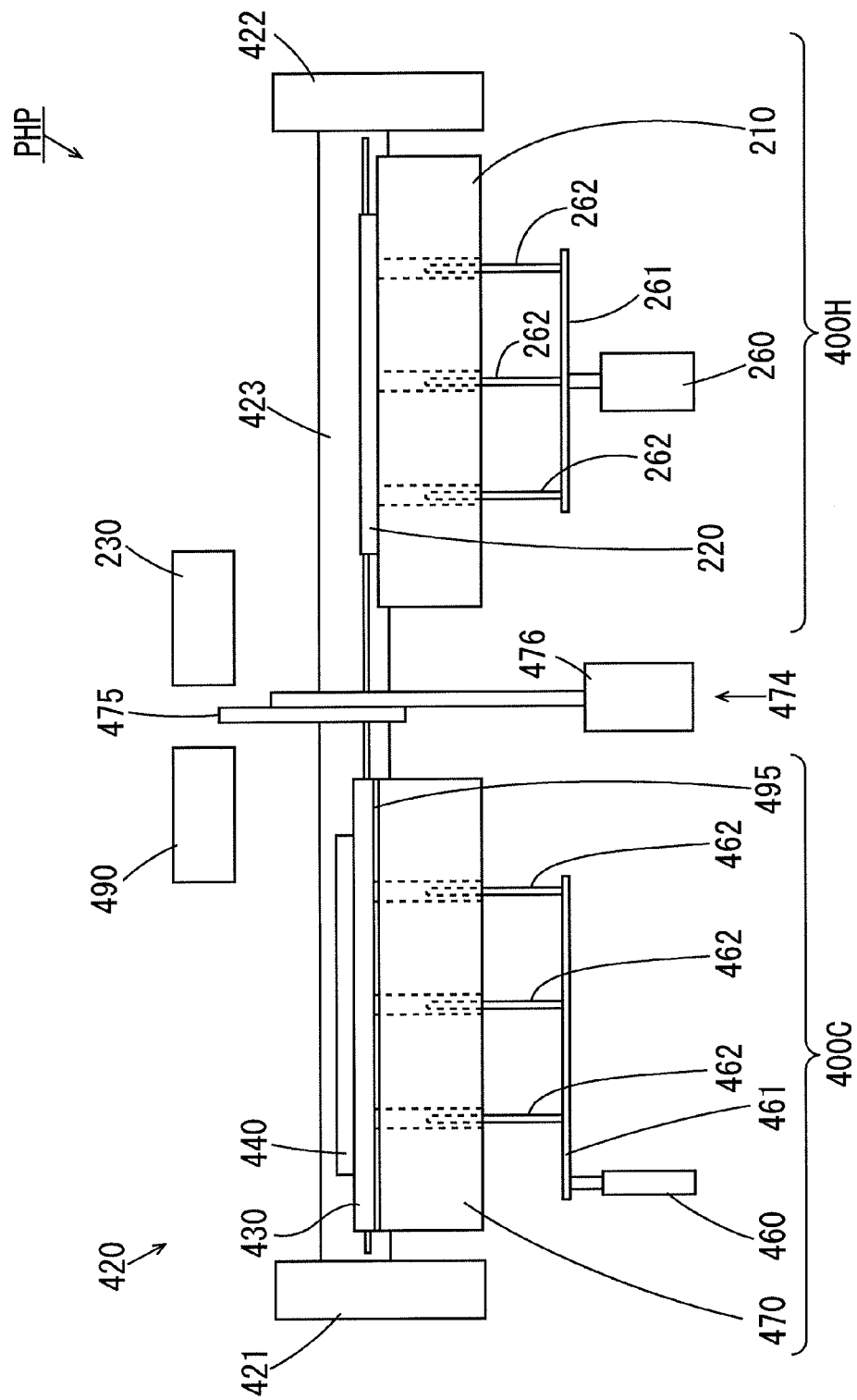
FIG. 14 is a side view of the thermal processing unit of FIG. 3.

FIG. 12 is a perspective view of the thermal processing unit PHP of FIG. 3, FIG. 13 is a plan view of the thermal processing unit PHP of FIG. 3 and FIG. 14 is a side view of the thermal processing unit PHP of FIG. 3.

As shown in FIGS. 12 to 14, the thermal processing unit PHP includes a cooling section 400C, a heating section 400H, a casing 410, a transport mechanism 420 and a shutter device 474. The cooling section 400C, the heating section 400H, the transport mechanism 420 are respectively stored in the casing 410. The shutter device 474 is not shown in FIG. 12. Further, the casing 410 is not shown in FIGS. 13 and 14.

The casing 410 is shaped to be rectangular parallelepiped. An opening 411 that connects the inner space of the casing 410 and an inner space of a transport chamber (the upper transport chamber 125, the lower transport chamber 126 of FIG. 5 or the like, for example) is formed at one side surface 410a (FIG. 12) of the casing 410. The substrate W is carried in and carried out through the opening 411 to/from the thermal processing unit PHP. An opening (not shown) is formed at the side surface adjacent to the cleaning/drying processing block 14A of the casing 410 in the thermal processing unit PHP adjacent to the cleaning/drying processing block 14A of the plurality of thermal processing units PHP of FIG. 3. The opening is used for carrying in and carrying out the substrates W between the inner space of the casing 410 and the cleaning/drying processing block 14A.

The cooling section 400C and the heating section 400H are arranged inside the casing 410 in this order in a direction from the one side surface 410a (FIG. 12) of the casing 410 toward another side surface 410b (FIG. 12) opposite to the one side surface 410a.

As shown in FIG. 14, the cooling section 400C includes a substrate placement plate 470, a lifting/lowering device 460, a coupling member 461, a plurality (three in this example) of support pins 462 and a thermal conduction sheet 495. A circulation flow path of cooling water (not shown) is formed in the substrate placement plate 470. The configuration of the lifting/lowering device 460, the coupling member 461 and the plurality of support pins 462 are respectively the same as the configuration of the lifting/lowering device 260, the coupling member 261 and the plurality of support pins 262 of FIG. 10. A plurality of support pin insertion holes for passing the plurality of support pins 462 are formed at the substrate placement plate 470. The thermal conduction sheet 495 is pasted on the upper surface of the substrate placement plate 470.

The heating section 400H includes the substrate suction sheet 220, the air suction device 230, the temperature processing device 250, the lifting/lowering device 260, the coupling member 261 and the plurality of support pins 262 of FIGS. 10 and 11. Only the substrate placement plate 210 of the temperature processing device 250 of FIGS. 10 and 11 is shown in FIGS. 12 to 14. In this example, the temperature regulating body 251 (FIG. 10) of the temperature processing device 250 is a heating element such as a mica heater.

The transport mechanism 420 includes two long-sized guide rails 421, 422 provided to extend in the vertical direction. As shown in FIG. 12, in the casing 410, the one guide rail 421 is fixed to the casing 410 adjacent to the one side surface 410a, and the other guide rail 422 is fixed to the casing 410 adjacent to another side surface 410b. A long-sized guide rail 423 is provided between the guide rail 421 and the guide rail 422. The guide rail 423 is attached to the guide rails 421, 422 to be movable in the vertical direction. A transport arm 430 is attached to the guide rail 423. The transport arm 430 is provided to be movable in the longitudinal direction of the guide rail 423.

The transport arm 430 is a flat-plate shaped member having a larger external shape than the external shape of the substrate W. The transport arm 430 is constituted by metallic material such as aluminium. A plurality of gas paths are formed in the transport arm 430. As shown in FIG. 13, on the upper surface of the transport arm 430, a plurality (three in this example) of openings 432b are formed at the center of the transport arm 430, and a plurality (three in this example) of openings 432a are formed at a portion positioned in the vicinity of the guide rail 423 in the transport arm 430. The three openings 432b formed at the center and the three openings 432a formed at a portion positioned in the vicinity of the guide rail 423 are connected with each other through the three gas paths respectively formed in the transport arm 430.

The transport mechanism 420 further includes an air suction device 490. As shown in FIG. 12, one ends of the three tubes SL are connected to the three openings 432a formed at the portion positioned in the vicinity of the guide rail 423 in the transport arm 430. The other ends of the three tubes SL are connected to the air suction device 490, respectively.

As shown in FIG. 13, a plurality of substrate suction sheets 440 are attached to a plurality (three in this example)

of portions on the upper surface of the transport arm 430, respectively. A plurality of projections 441 and a seal projection 442 are formed to project upward from the upper surface of each substrate suction sheet 440. The seal projection 442 is formed to extend along the outer periphery of the substrate suction sheet 440. The plurality of projections 441 are formed to disperse in the region inside the seal projection 442. The plurality of projections 441 and the seal projection 442 have the same height. A through hole is formed at the center of each substrate suction sheet 440. Each substrate suction sheet 440 is attached to the transport arm 430 such that a region in which the through hole is formed overlaps with any one of the openings 432b formed at the center of the transport arm 430.

The air suction device 490 operates such that an atmosphere above the three openings 432b formed at the center of the transport arm 430 is sucked by the air suction device 490 through the through hole of the substrate suction sheet 440, the gas path in the transport arm 430 and the tube SL.

Further, slits 431 are provided at the transport arm 430 so as not to interfere with the plurality of support pins 462 of the lifting/lowering device 460 in the cooling section 400C.

In the thermal processing unit PHP, the shutter device 474 is provided between the cooling section 400C and the heating section 400H. The shutter device 474 includes a shutter 475 and a shutter driver 476.

In this example, the shutter driver 476 moves the shutter 475 between a position above the upper surface of the substrate placement plate 470 and the upper surface of the substrate placement plate 210 (hereinafter referred to as a closed position) and a position below the upper surface of the substrate placement plate 470 and the upper surface of the substrate placement plate 210 (hereinafter referred to as an opened position). When the shutter 475 is at the closed position, the space that surrounds the cooling section 400C and the space that surrounds the heating section 400H in the casing 410 are shielded by the shutter 475. On the other hand, when the shutter 475 is at the opened position, the space that surrounds the cooling section 400C and the space that surrounds the heating section 400H in the casing 410 communicate with each other.

(9-2) Operation of Thermal Processing Unit

The operation of the thermal processing unit PHP of FIGS. 12 to 14 will be described. FIGS. 15 to 24 are schematic side views showing the operation of the thermal processing unit PHP. Part of the constituent elements of the plurality of constituent elements shown in FIG. 14 is shown in FIGS. 15 to 24.

Figure 15:
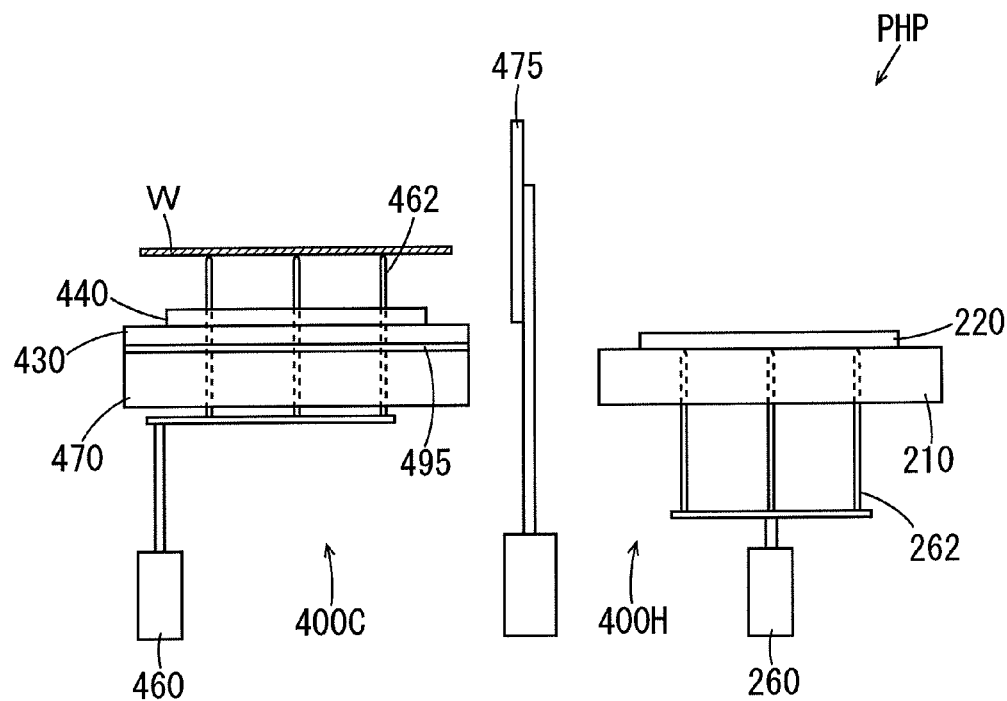
FIG. 15 is a schematic side view showing the operation of the thermal processing unit.

As shown in FIG. 15, the upper ends of the plurality of support pins 462 in the cooling section 400C are respectively positioned above the substrate placement plate 470, and the transport arm 430 of the transport mechanism 420 comes into contact with the thermal conduction sheet 495 on the substrate placement plate 470. Further, the upper ends of the plurality of support pins 262 in the heating section 400H are respectively positioned below the upper surface of the substrate placement plate 210. Further, the shutter 475 is at the closed position. In this state, the substrate W that has been carried into the thermal processing unit PHP through the opening 411 (FIG. 12) of the casing 410 is placed on the plurality of support pins 462 in the cooling section 400C.

Figure 16:
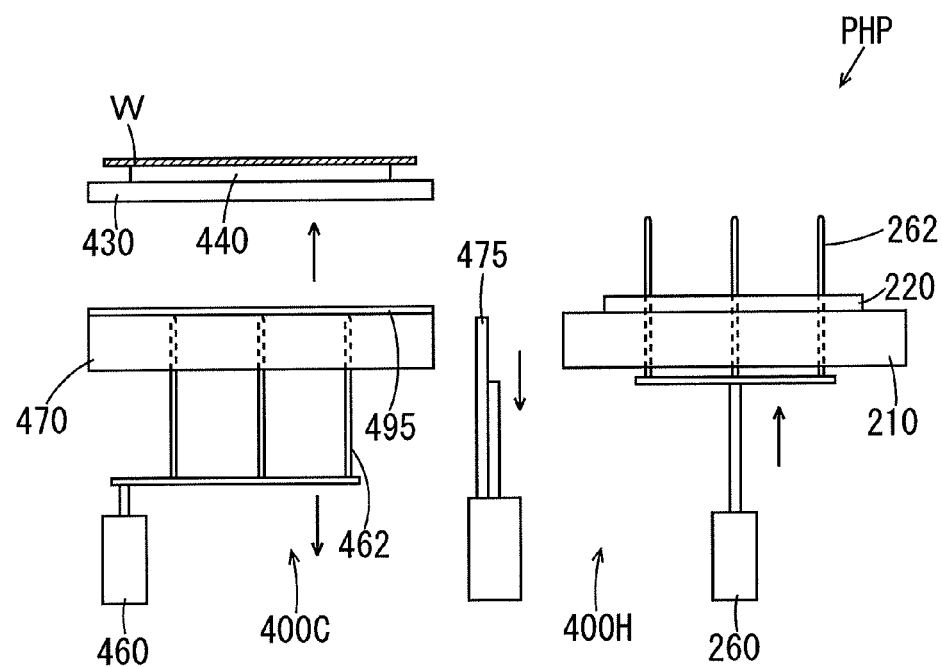
FIG. 16 is a schematic side view showing the operation of the thermal processing unit.

Next, as shown in FIG. 16, the transport arm 430 of the transport mechanism 420 is lifted to a position above the substrate placement plate 470 in the cooling section 400C, and the plurality of support pins 462 in the cooling section 400C are lowered to a position below the upper surface of the substrate placement plate 470. Thus, the substrate W is transferred from the plurality of support pins 462 in the cooling section 400C to the transport arm 430, and the substrate W is placed on the plurality of substrate suction sheets 440. In this state, the air suction device 490 of FIG. 12 operates such that the back surface of the substrate W is held by suction by the plurality of substrate suction sheets 440. Further, the upper ends of the plurality of support pins 262 in the heating section 400H are lifted to a position above the upper surface of the substrate placement plate 210, respectively. Further, the shutter 475 is moved from the closed position to the opened position.

Figure 17:
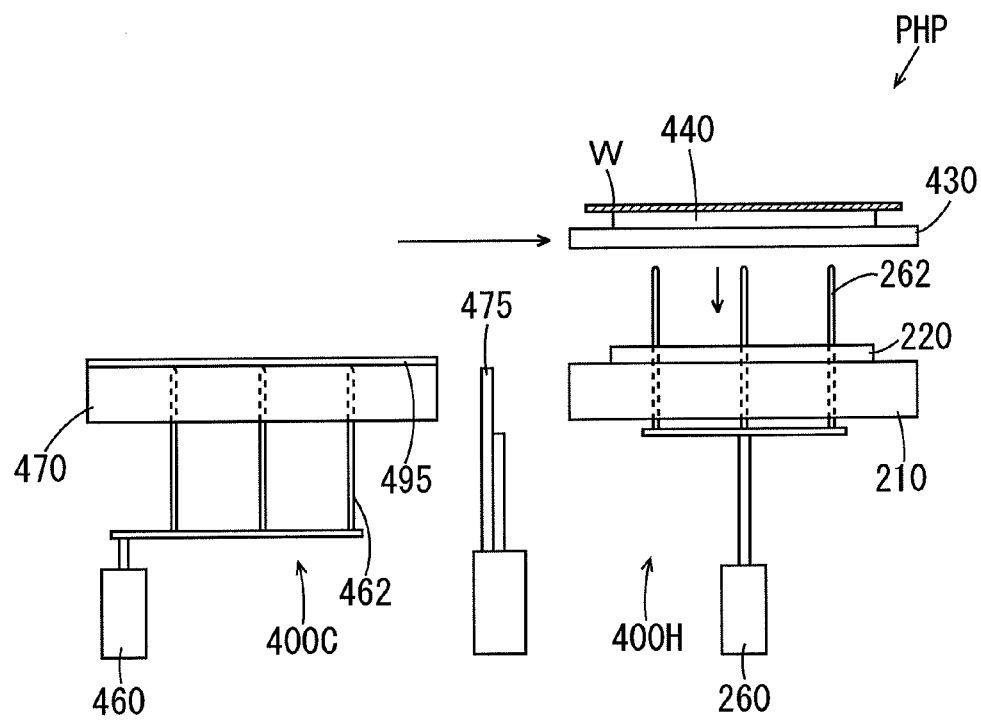
FIG. 17 is a schematic side view showing the operation of the thermal processing unit.
Figure 18:
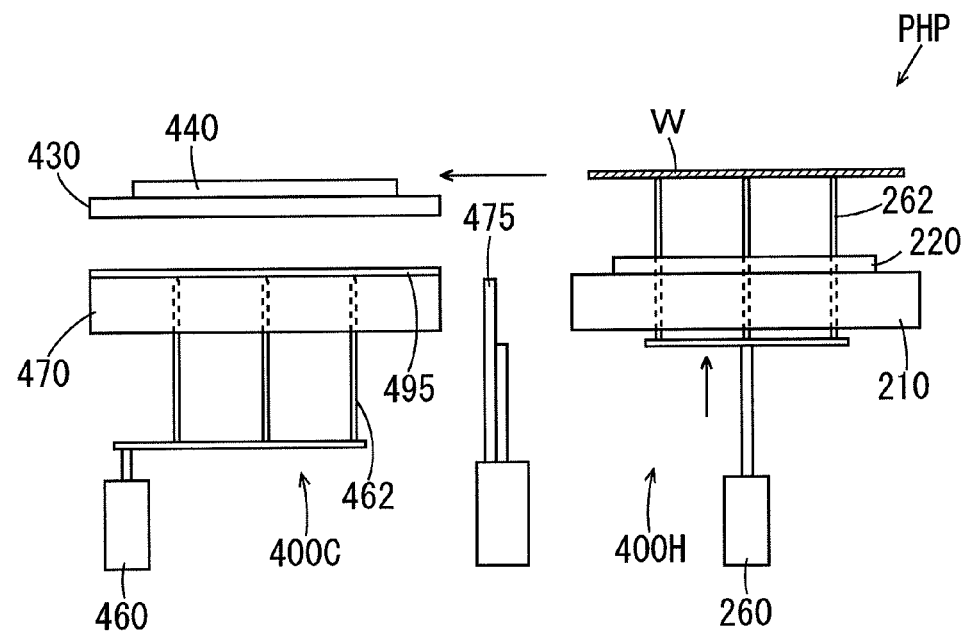
FIG. 18 is a schematic side view showing the operation of the thermal processing unit.

Next, as shown in FIG. 17, the transport arm 430 is moved from a position above the substrate placement plate 470 in the cooling section 400C to a position above the substrate placement plate 210 in the heating section 400H. Thereafter, the operation of the air suction device 490 of FIG. 12 is stopped. Subsequently, the transport arm 430 is lowered to a position below the upper ends of the plurality of support pins 262. Thus, as shown in FIG. 18, the substrate W is placed on the plurality of support pins 262 in the heating section 400H. Thereafter, the transport arm 430 is moved to a position above the substrate placement plate 470 in the cooling section 400C.

Figure 19:
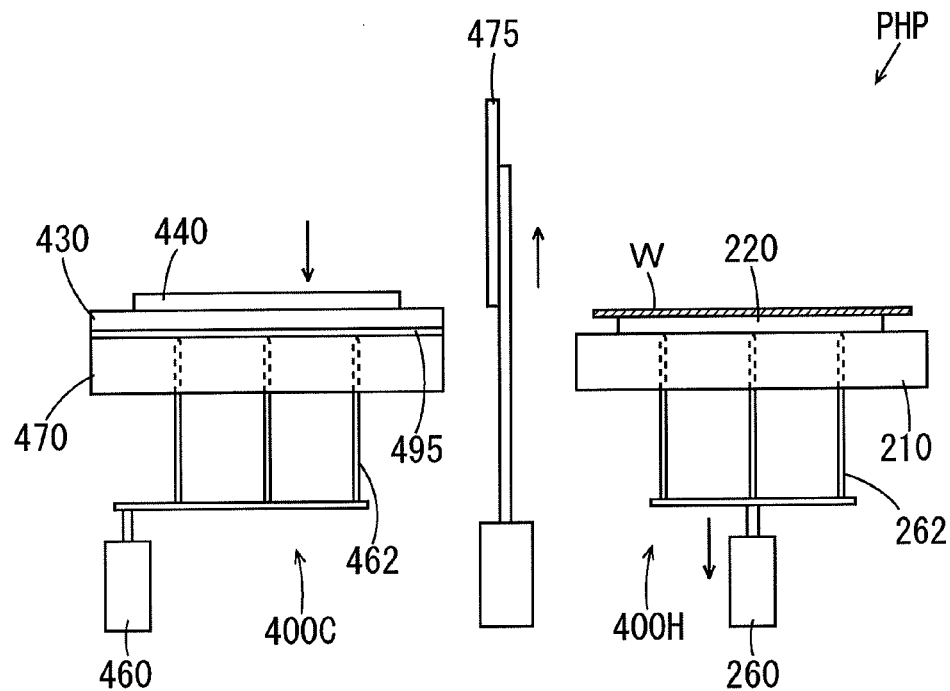
FIG. 19 is a schematic side view showing the operation of the thermal processing unit.

Then, as shown in FIG. 19, the plurality of support pins 262 in the heating section 400H are lowered to a position below the upper surface of the substrate placement plate 210. Thus, the substrate W is placed on the substrate suction sheet 220. In this state, the air suction device 230 of FIG. 12 operates such that the back surface of the substrate W is held by suction by the substrate suction sheet 220. Further, the transport arm 430 comes into contact with the thermal conduction sheet 495 on the substrate placement plate 470 by being lowered. Thus, the transport arm 430 is cooled on the substrate placement plate 470. Further, the shutter 475 is moved from the opened position to the closed position. As described above, the temperature regulating body 251 of FIG. 10 generates heat while the substrate W is held by suction by the substrate suction sheet 220, so that the substrate W is heated.

Figure 20:
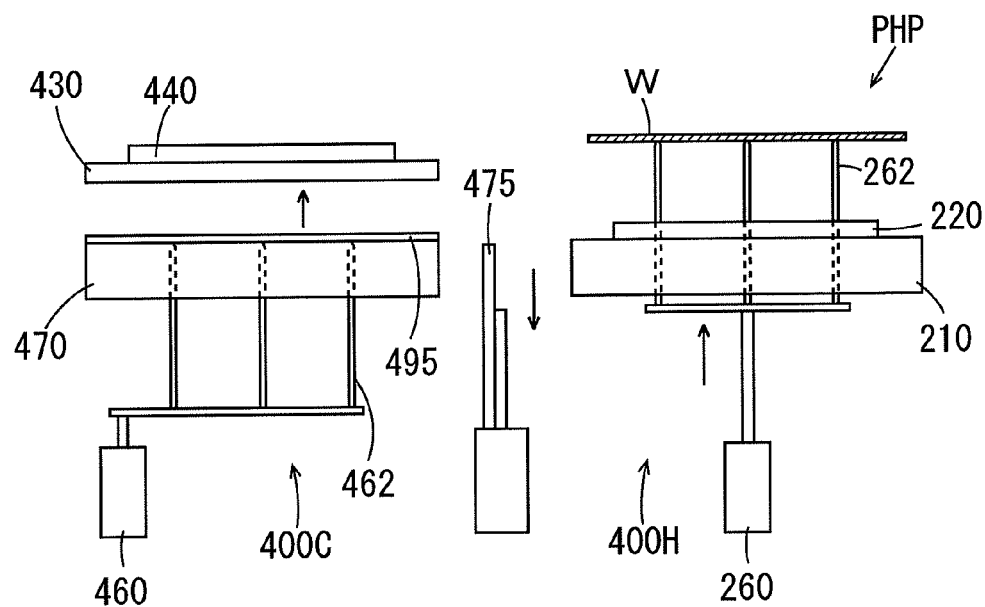
FIG. 20 is a schematic side view showing the operation of the thermal processing unit.

Next, as shown in FIG. 20, after the operation of the air suction device 230 of FIG. 12 is stopped, the upper ends of the plurality of support pins 262 in the heating section 400H are lifted to a position above the upper surface of the substrate placement plate 210. Thus, the substrate W is supported by the plurality of support pins 262 in the heating section 400H. Further, the transport arm 430 of the transport mechanism 420 is lifted to a position above the substrate placement plate 470 in the cooling section 400C. Further, the shutter 475 is moved from the closed position to the opened position.

Figure 21:
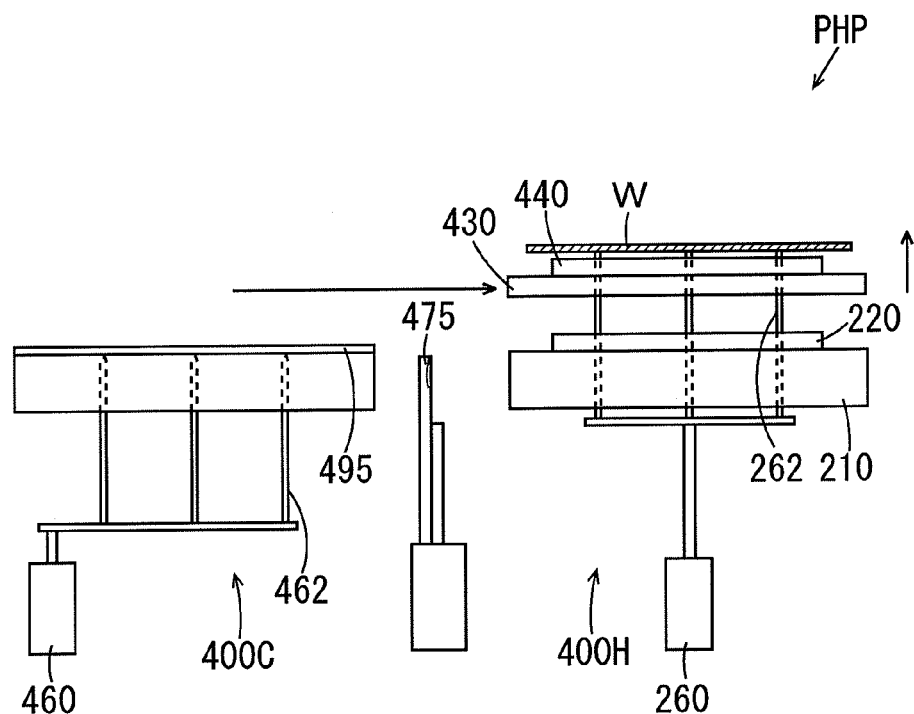
FIG. 21 is a schematic side view showing the operation of the thermal processing unit.
Figure 22:
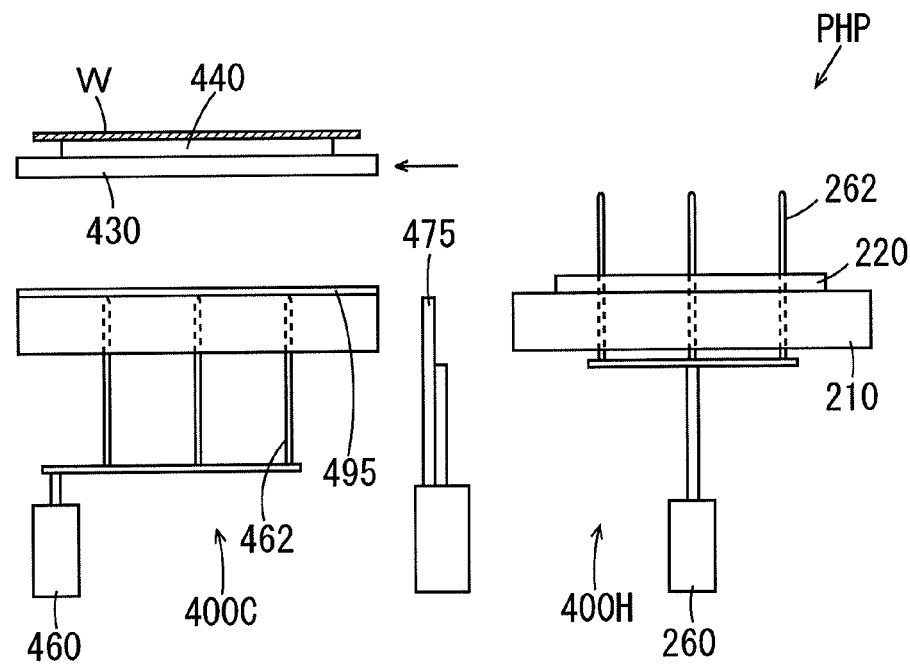
FIG. 22 is a schematic side view showing the operation of the thermal processing unit.

Then, as shown in FIG. 21, the transport arm 430 is moved from a position above the substrate placement plate 470 in the cooling section 400C to a position above the substrate placement plate 210 in the heating section 400H. Subsequently, the transport arm 430 is lifted to a position above the upper ends of the plurality of support pins 262 in the heating section 400H. Thus, the substrate W is received by the transport arm 430. At this time, the substrate W is placed on the plurality of substrate suction sheets 440. The air suction device 490 of FIG. 12 operates such that the back surface of the substrate W is held by suction by the substrate suction sheet 440. Thereafter, as shown in FIG. 22, the transport arm 430 is moved to a position above the substrate placement plate 470 in the cooling section 400C.

Figure 23:
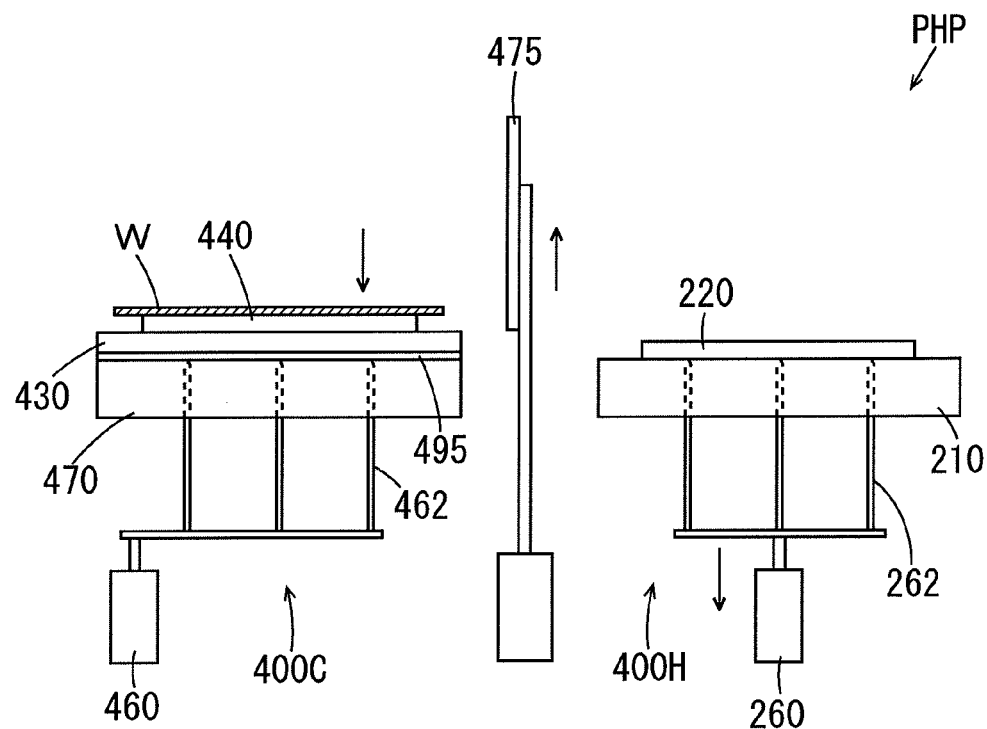
FIG. 23 is a schematic side view showing the operation of the thermal processing unit.

Then, as shown in FIG. 23, the transport arm 430 is lowered until the transport arm 430 comes into contact with the thermal conduction sheet 495 on the substrate placement plate 470, the shutter 475 is moved from the opened position to the closed position and the plurality of support pins 262 in the heating section 400H are lowered to a position below the upper surface of the substrate placement plate 210. In this case, the transport arm 430 comes into contact with the thermal conduction sheet 495 on the substrate placement plate 470 such that the substrate W is cooled on the substrate placement plate 470 together with the transport arm 430.

Figure 24:
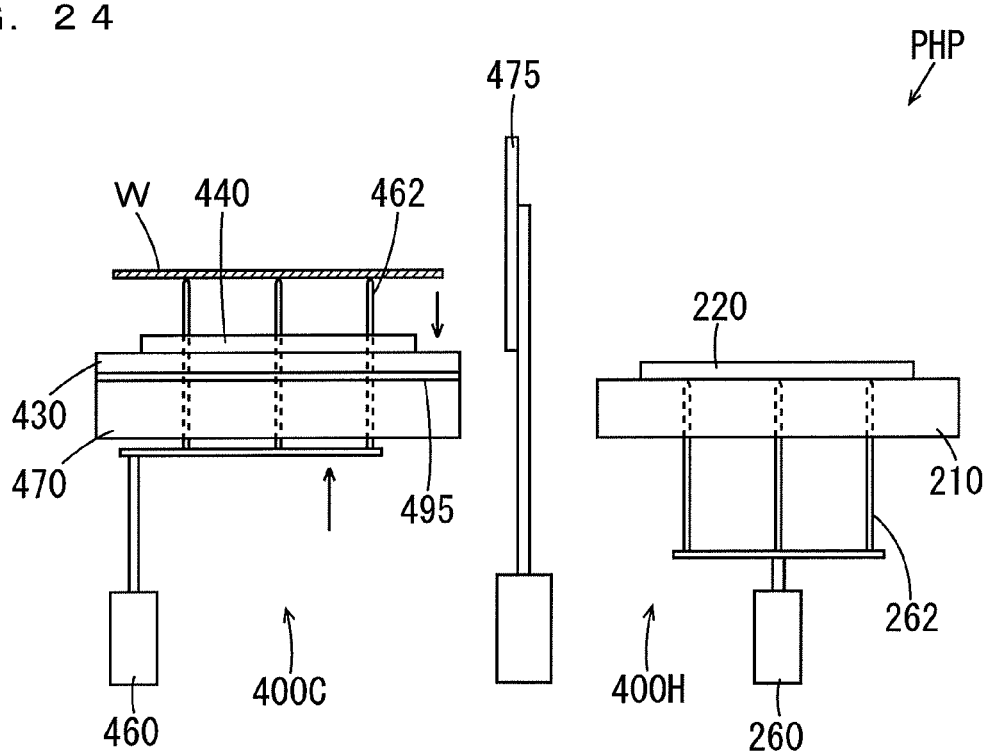
FIG. 24 is a schematic side view showing the operation of the thermal processing unit.

Finally, as shown in FIG. 24, after the operation of the air suction device 490 of FIG. 12 is stopped, the upper ends of the plurality of support pins 462 in the cooling section 400C are lifted to a position above the upper surface of the substrate placement plate 470. Thus, the substrate W is supported by the plurality of support pins 462 in the cooling section 400C. In this state, the substrate W on the plurality of support pins 462 is received by a transport mechanism (not shown).

As described above, the substrate suction sheets 220, 440 hold the back surface of the substrate W by suction without coming into contact with the edge of the substrate W. Therefore, a member that holds the substrate W or a member that supports the substrate W does not come into contact with the edge of the substrate W in the thermal processing unit PHP of FIG. 3. Thus, the temperature processing can be performed on the substrate W while a contaminant is prevented from occurring and being transferred to the edge of the substrate W.

Further, the heating processing and the cooling processing are performed on the substrate W while the back surface of the substrate W is held by suction by the substrate suction sheets 220, 440. In this case, uniform temperature processing can be performed on the substrate W while the substrate W is prevented from deformation.

Figure 25:
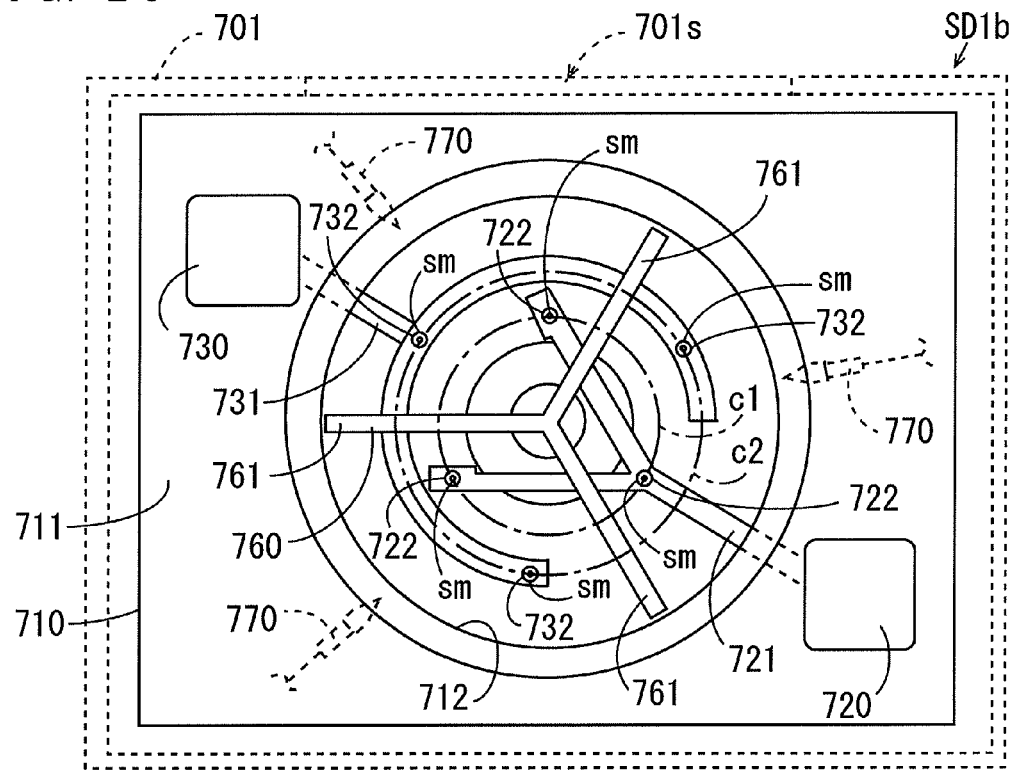
FIG. 25 is a plan view of a back surface cleaning unit of FIG. 2.
Figure 26:
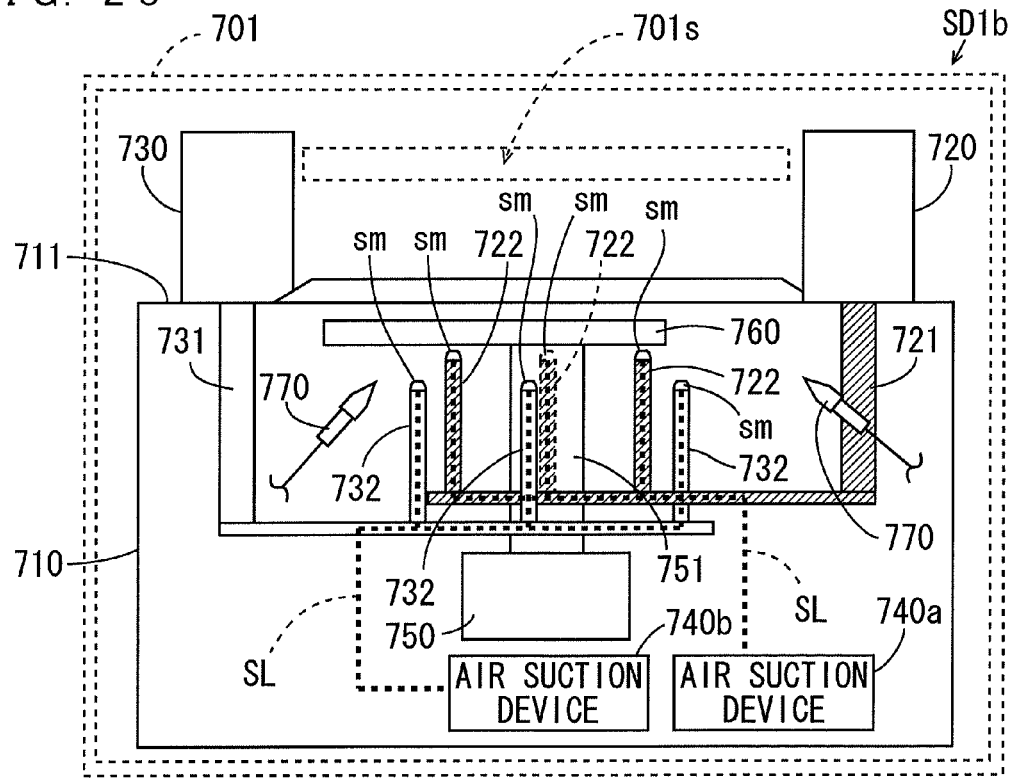
FIG. 26 is a side view of the back surface cleaning unit of FIG. 2.

(10) Back Surface Cleaning Unit (10-1) Configuration of Back Surface Cleaning Unit FIG. 25 is a plan view of a back surface cleaning unit SD1b of FIG. 2, and FIG. 26 is a side view of the back surface cleaning unit SD1b of FIG. 2. The back surface cleaning unit SD1b has a casing 701. An opening 701s for carrying in and carrying out the substrates W to/from the back surface cleaning unit SD1b is formed at the one side surface of the casing 701. The casing 701 is indicated by the dotted line in FIG. 25 and FIG. 26.

A casing 710 for cleaning a substrate is provided inside the casing 701. The casing 710 for cleaning a substrate is shaped to be rectangular parallelepiped. A circular opening 712 larger than the external shape of the substrate W is formed at the center of the upper surface 711 of the casing 710 for cleaning a substrate. Lifting and lowering devices 720, 730 are provided on the upper surface 711 of the casing 710 for cleaning a substrate to be opposite to each other with the circular opening 712 sandwiched therebetween.

A motor 750 is provided at the lower portion in the casing 710 for cleaning a substrate. A rotation shaft 751 of the motor 750 is provided to extend upward from the motor 750. The motor 750 is arranged such that an extending line from the axis of the rotation shaft 751 passes through the center of the circular opening 712 of the casing 710 for cleaning a substrate. A substantially Y-shaped cleaning brush 760 is attached to the upper end of the rotation shaft 751 in a horizontal attitude. The center of the cleaning brush 760 is positioned on the axis of the rotation shaft 751. The cleaning brush 760 includes three bar-shaped brushes 761 that extend from the center in three directions at equal angular intervals.

Further, three first support pins 722 are provided inside the casing 710 for cleaning a substrate to surround the rotation shaft 751 on an imaginary circle c1 with the axis of the rotation shaft 751 as a center and extend in the vertical direction. The lower ends of the three first support pins 722 are respectively connected to the coupling member 721. The coupling member 721 is attached to the lifting/lowering device 720. The lifting/lowering device 720 operates such that the coupling member 721 is moved in the vertical direction together with the three first support pins 722. Three suction portions sm are respectively provided at the upper ends of the three first support pins 722. One end of the tube SL made of resin is connected to each suction portion sm. The other end of each tube SL is connected to an air suction device 740a provided in the casing 710 for cleaning a substrate.

Further, three second support pins 732 are provided inside the casing 710 for cleaning a substrate to surround the rotation shaft 751 on an imaginary circle c2 with the axis of the rotation shaft 751 as a center and extend in the vertical direction. As shown in FIG. 25, the diameter of the imaginary circle c2 is larger than that of the imaginary circle c1 and smaller than that of the substrate W. The lower ends of the three second support pins 732 are respectively connected to the coupling member 731. The coupling member 731 is attached to the lifting/lowering device 730. The lifting/lowering device 730 operates such that the coupling member 731 is moved in the vertical direction together with the three second support pins 732. The three suction portions sm are respectively provided at the upper ends of the three second support pins 732. The one end of the tube SL made of resin is connected to each suction portion sm. The other end of each tube SL is connected to an air suction device 740b provided in the casing 710 for cleaning a substrate. In FIG. 26 and the subsequent diagrams described below, the coupling member 721 and the three first support pins 722 are indicated by hatching such that the three first support pins 722 and the three second support pins 732 are easily recognized.

Further, three cleaning liquid injection nozzles 770 arranged obliquely with respect to the vertical direction to extend from below toward the center of the circular opening 712 are provided inside the casing 710 for cleaning a substrate. The three cleaning liquid injection nozzles 770 are arranged at equal angular intervals with respect to the axis of the rotation shaft 751. The three cleaning liquid injection nozzles 770 are respectively connected to a cleaning liquid supply system (not shown). In this example, a cleaning liquid such as pure water is supplied to the cleaning liquid injection nozzles 770.

(10-2) Operation of Back Surface Cleaning Unit

The operation of the back surface cleaning unit SD1b of FIGS. 25 and 26 will be described. FIGS. 27(a) to 33(b) are plan views and side views showing the operation of the back surface cleaning unit SD1b. A plan view of the back surface cleaning unit SD1b is shown in each of FIGS. 27(a), 28(a), 29(a), 30(a), 31(a), 32(a), 33(a), and a side view for the back surface cleaning unit SD1b is shown in each of 27(b), 28(b), 29(b), 30(b), 31(b), 32(b), 33(b).

In FIGS. 27 to 33, the casing 701 of FIGS. 25 and 26 is not shown. In the side views of the back surface cleaning unit SD1b, the lifting/lowering device 720, 730 and the casing 710 for cleaning a substrate of FIGS. 25 and 26 are indicated by the dotted line.

In the initial state, the lifting/lowering device 720 operates such that the coupling member 721 is lifted and the three suction portions sm of the three first support pins 722 are respectively lifted to a position above the cleaning brush 760. On the other hand, the three suction portions sm of the three second support pins 732 are respectively held at a position below the cleaning brush 760. In this state, as shown in FIGS. 27(a), 27(b), the substrate W that has been carried into the back surface cleaning unit SD1b through the opening 701s (FIG. 26) of the casing 701 is placed on the three suction portions sm of the three first support pins 722. When the air suction device 740a of FIG. 26 operates, the back surface of the substrate W is held by suction by the three suction portions sm of the three first support pins 722. In FIG. 27(a), the contact portions on the back surface of the substrate W with the three suction portions sm of the three first support pins 722 are indicated by reference numerals p1.

Figure 28:
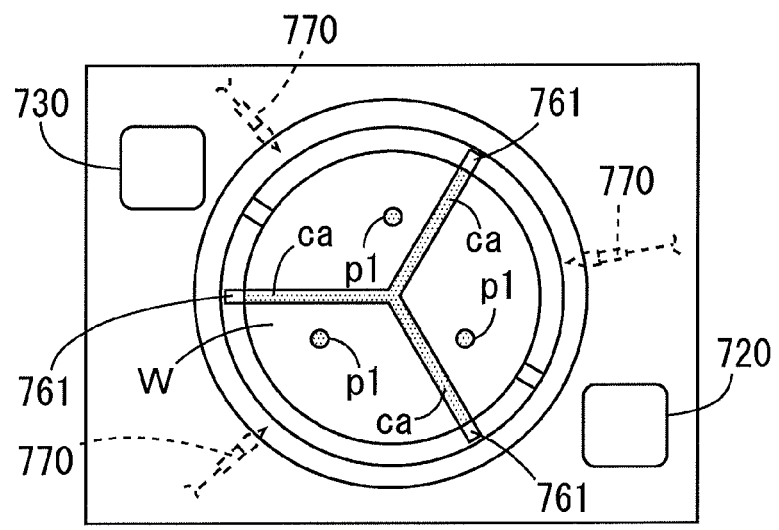
Figure 28:
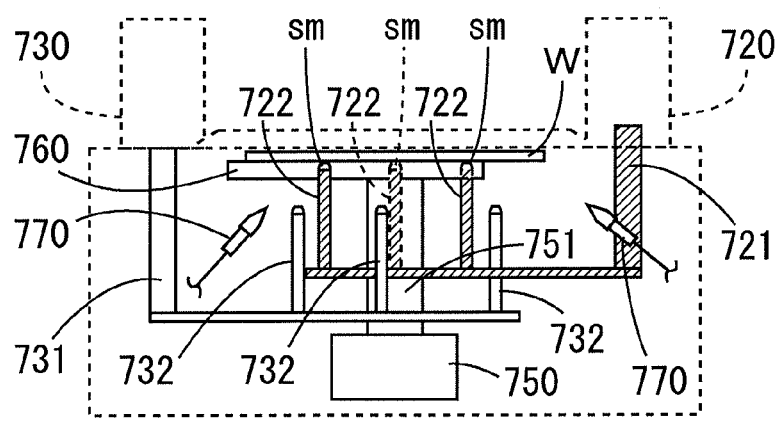

Next, the lifting/lowering device 720 operates such that the three first support pins 722 are lowered to a height at which the back surface of the substrate W comes into contact with the cleaning brush 760 as shown in FIG. 28. In FIG. 28(a), the contact portion on the back surface of the substrate W with the cleaning brush 760 is indicated by reference numerals ca.

Figure 29:
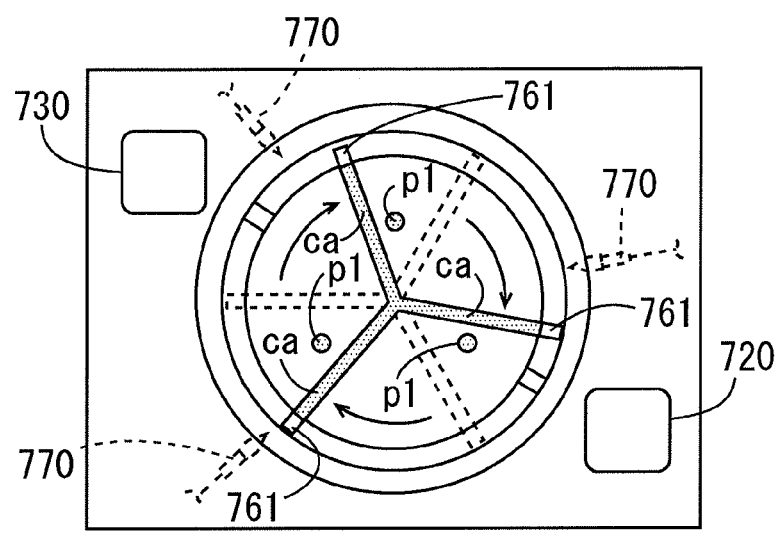
Figure 29:
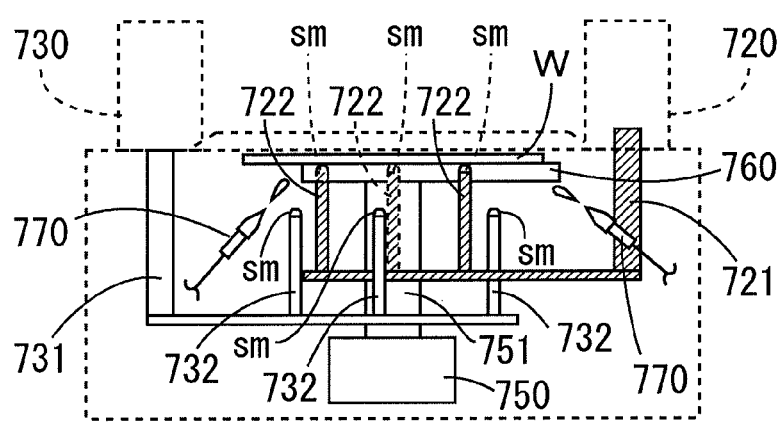

Then, as shown in FIG. 29, a cleaning liquid (pure water in this example) is injected from the three cleaning liquid injection nozzles 770 toward the back surface of the substrate W. Thereafter, the motor 750 operates such that the cleaning brush 760 is rotated by a predetermined angle with the axis of the rotation shaft 751 as a center. When the cleaning brush 760 includes the three bar-shaped brushes 761 extending in three directions at equal angular intervals as in this example, a predetermined angle is set to be larger than 60°, for example. In this manner, a partial region on the back surface of the substrate W is physically cleaned by the cleaning brush 760 while the cleaning liquid is supplied to the back surface of the substrate W.

Figure 30:
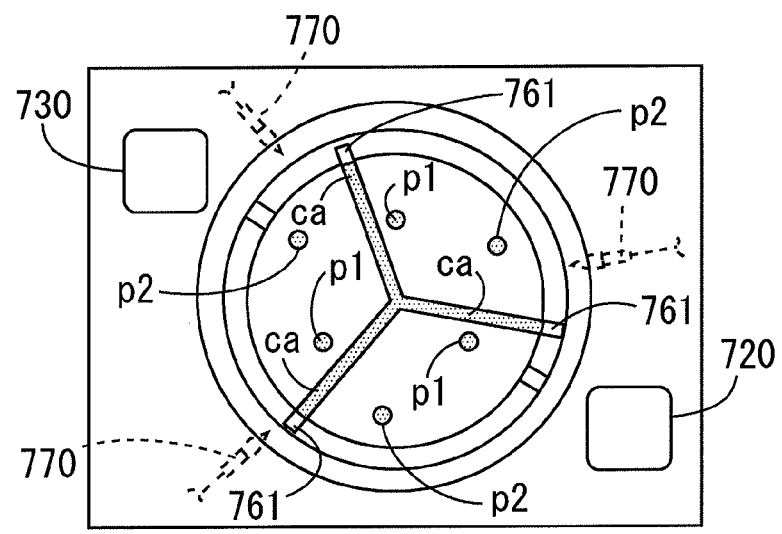
Figure 30:
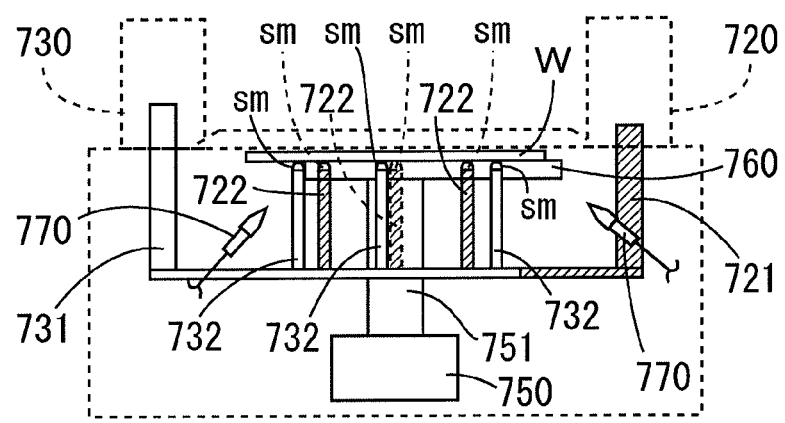

Next, after injection of the cleaning liquid to the substrate W is stopped, the lifting/lowering device 730 operates such that the three second support pins 722 are lifted until the three suction portions sm of the three second support pins 732 come into contact with the back surface of the substrate W as shown in FIG. 30. Thereafter, when the air suction device 740b of FIG. 26 operates, the back surface of the substrate W is held by suction by the three suction portions sm of the three second support pins 732. In FIG. 30(a), the contact portions on the back surface of the substrate W with the three suction portions sm of the three second support pins 732 are indicated by reference numerals p2.

Figure 31:
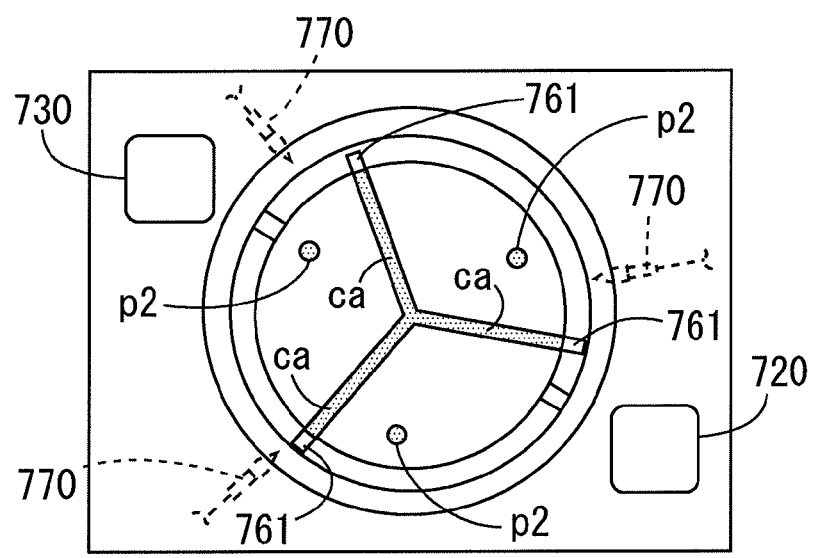
Figure 31:
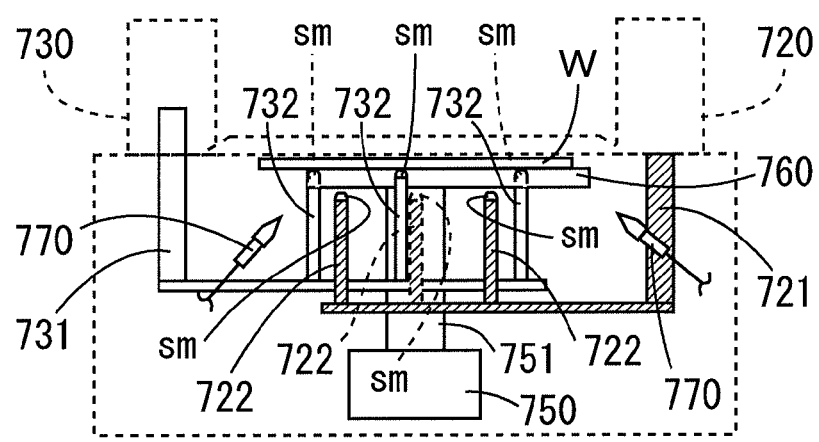

Then, after the operation of the air suction device 740a of FIG. 26 is stopped, the lifting/lowering device 720 operates such that the three suction portions sm of the three first support pins 722 are respectively lowered to a position below the cleaning brush 760 as shown in FIG. 31.

Figure 32:
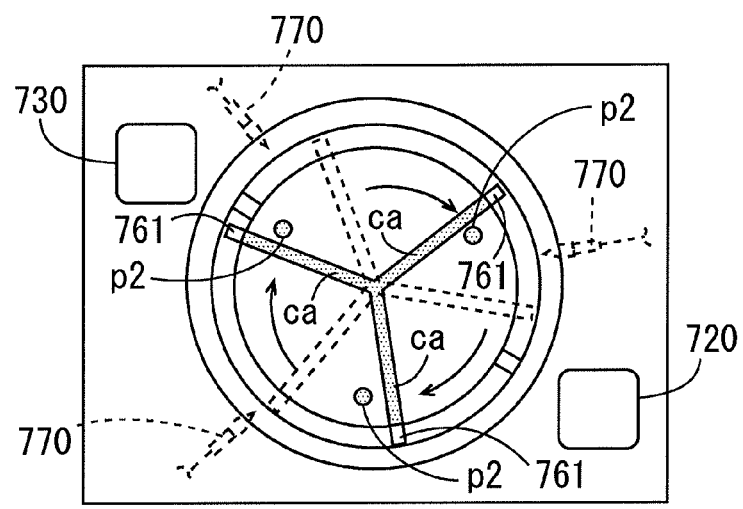
Figure 32:
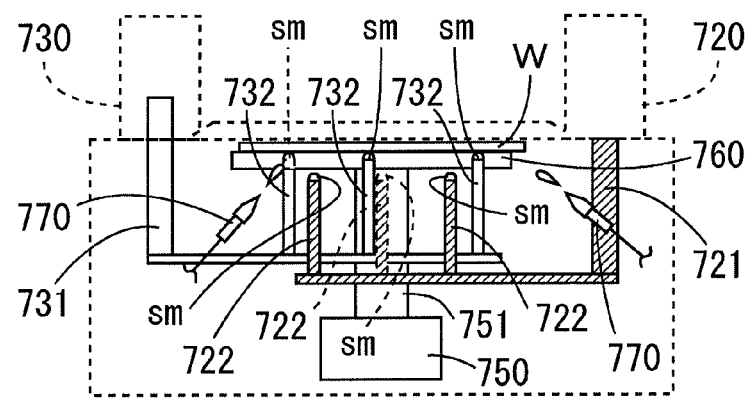

Next, as shown in FIG. 32, a cleaning liquid (pure water in this example) is injected from the three cleaning liquid injection nozzles 770 toward the back surface of the substrate W. Thereafter, the motor 750 operates such that the cleaning brush 760 is rotated again by a predetermined angle (an angle larger than 60° in this example) with the axis of the rotation shaft 751 as a center. In this manner, the remaining region on the back surface of the substrate W is physically cleaned by the cleaning brush 760 while the cleaning liquid is supplied to the back surface of the substrate W.

Figure 33:
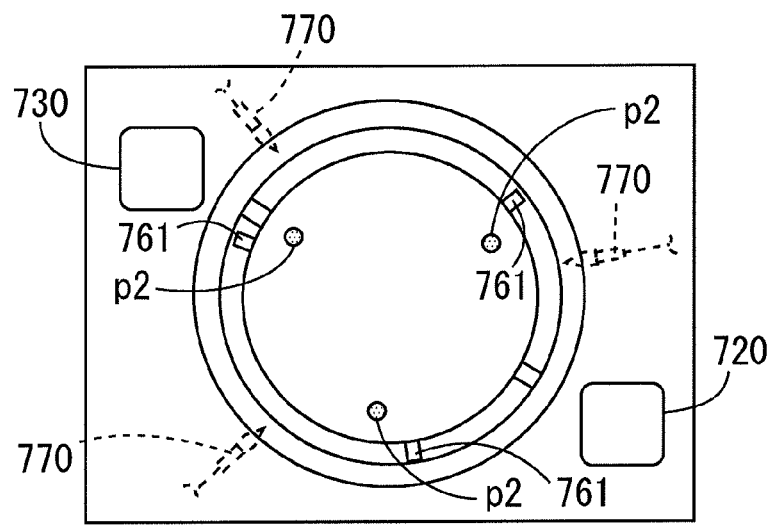
Figure 33:
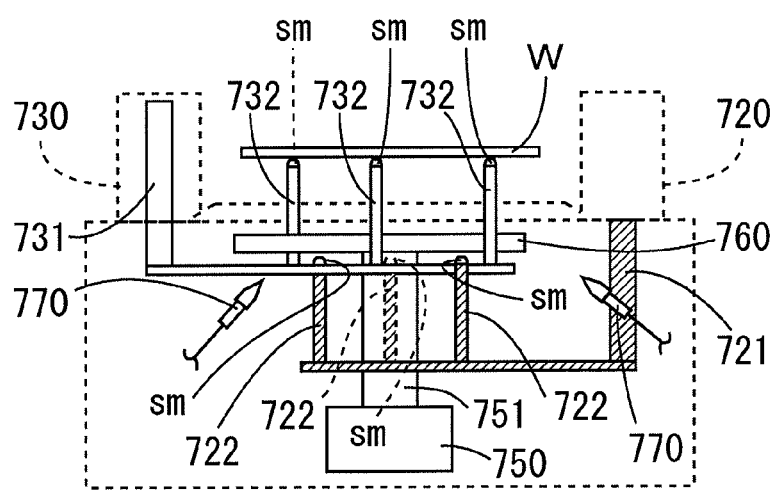

Next, after the injection of the cleaning liquid to the substrate W is stopped, the lifting/lowering device 730 operates such that the three suction portions sm of the three second support pins 732 are lifted to a position above the cleaning brush 760 as shown in FIG. 33. Subsequently, after the operation of the air suction device 740b of FIG. 26 is stopped, the substrate W supported on the three second support pins 732 is received by the transport mechanism (not shown).

As described above, the entire back surface of the substrate W is cleaned with the substrate not being rotated while the back surface of the substrate W is held by suction by the three suction portions sm. Therefore, in the back surface cleaning unit SD1b, a member that holds the substrate W or a member that supports the substrate W does not come into contact with the edge of the substrate W. Thus, the back surface of the substrate W can be cleaned while a contaminant is prevented from occurring and being transferred to the edge of the substrate W.

Further, as described above, in the present embodiment, after a resist film and a resist cover film are formed and the predetermined thermal processing is performed, the back surface of the substrate W is cleaned before the exposure processing by the exposure device 15. Thus, defocusing due to a contaminant that has adhered to the other surface of the substrate W is prevented.

(11) Peripheral Edge and Edge of Substrate

Figure 34:
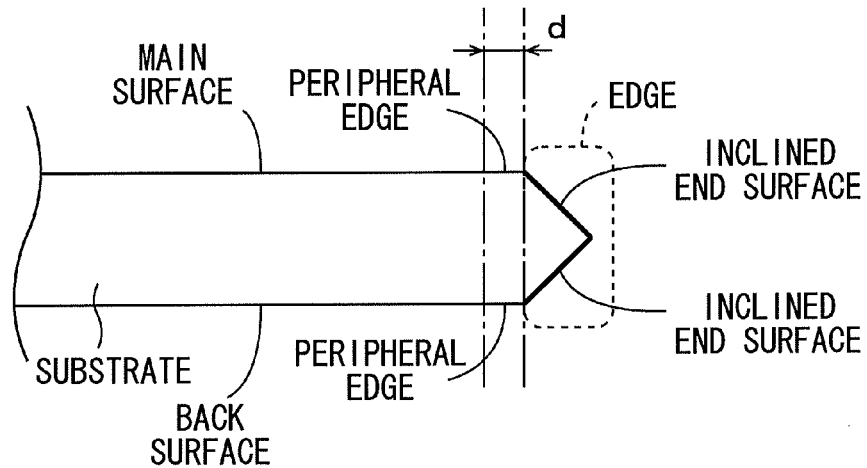
Figure 34:
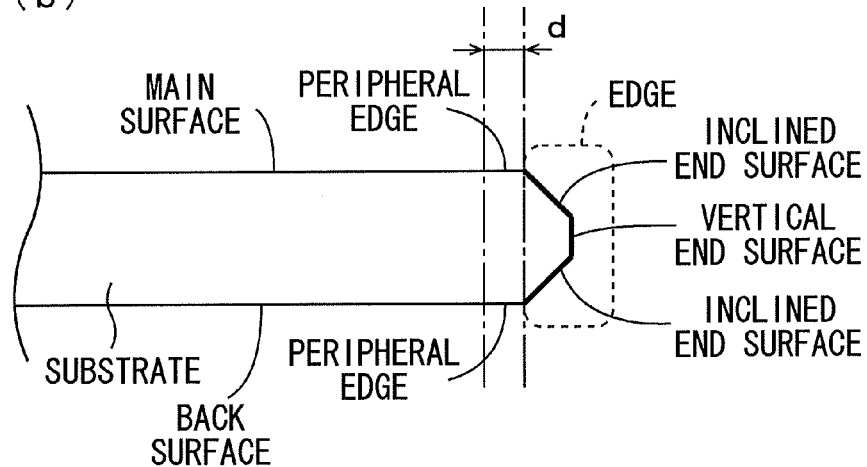
Figure 34:
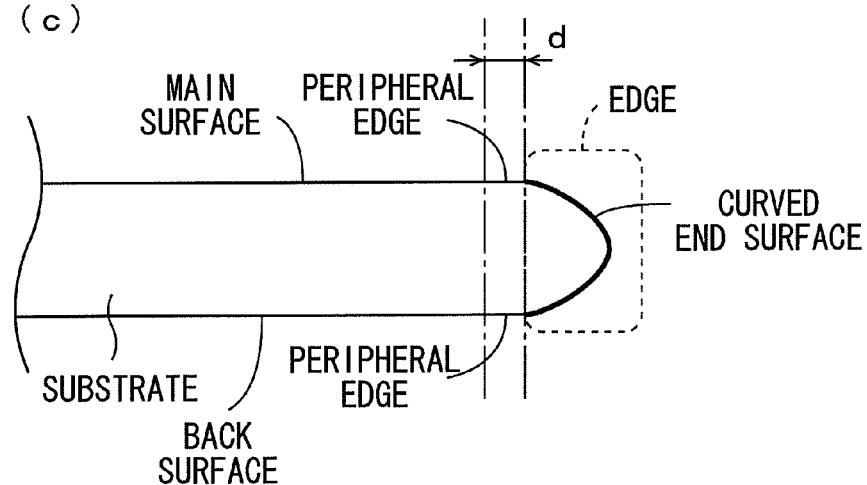

FIG. 34 is a diagram for explaining the peripheral edge and the edge of the substrate W defined in one embodiment of the present invention. Partially enlarged side views of a plurality of types of the substrate W different from each other are shown in FIGS. 34(a), 34(b), 34(c).

In the present embodiment, a region with a constant width d extending inward from the end of the main surface and the back surface of the substrate W is referred to as a peripheral edge of the substrate W. Further, the edge of the substrate W refers to the end surface of the substrate W except for the peripheral edges of the main surface and the back surface of the substrate W as indicated by the thick solid line in FIGS. 34(a), 34(b), 34(c).

The substrate W of FIG. 34(a) has two inclined end surfaces. The one inclined end surface is inclined downward from the end of the main surface of the substrate W, and the other inclined end surface is inclined upward from the end of the back surface of the substrate W. In this case, the edge of the substrate W is constituted by the two inclined end surfaces.

The substrate W of FIG. 34(b) has the two inclined end surfaces and one vertical end surface. The one inclined end surface is inclined downward from the end of the main surface of the substrate W, and the other inclined end surface is inclined upward from the end of the back surface of the substrate W. A vertical end surface that extends in a direction orthogonal to the main surface and the back surface of the substrate W is formed between the two inclined end surfaces. In this case, the edge of the substrate W is constituted by the two inclined end surfaces and the one vertical end surface.

The substrate W of FIG. 34(c) includes a curved end surface that curves in the vertical direction from the end of the main surface to the end of the back surface of the substrate W. In this case, the edge of the substrate W is formed of the curved end surface.

(12) Effects of Present Embodiment

As described above, each of all the transport mechanisms 115, 127, 128, 137, 138, 141, 142, 146, 420 included in the substrate processing apparatus 100 transports the substrate W while holding the back surface thereof without coming into contact with the edge of the substrate W.

Further, each of the plurality of coating processing units 129 and the plurality of development processing unit 139 included in the substrate processing apparatus 100 supplies a processing liquid to the main surface of the substrate W while holding the back surface of the substrate W without coming into contact with the edge of the substrate W.

Further, each of the plurality of thermal processing units PHP, the plurality of adhesion reinforcement processing units PAHP, the plurality of cooling units CP and the plurality of the placement/cooling platforms P-CP included in the substrate processing apparatus 100 performs temperature processing on the substrate W while holding the back surface of the substrate W without coming into contact with the edge of the substrate W.

Further, each of the plurality of edge exposure units EEW included in the substrate processing apparatus 100 performs the edge exposure processing on the main surface of the substrate W while holding the back surface of the substrate W without coming into contact with the edge of the substrate W.

Further, each of the substrate platforms PASS1 to PASS9 and the placement/buffer sections P-BF1, P-BF2 included in the substrate processing apparatus 100 supports the back surface of the substrate W without coming into contact with the edge of the substrate W.

In this manner, in the substrate processing apparatus 100 according to the present embodiment, a member that holds the substrate W or a member that supports the substrate W does not come into contact with the edge of the substrate W. Thus, a contaminant that occurs when a holding member or a supporting member of the substrate W comes into contact with the edge of the substrate W is prevented. Further, a contaminant is prevented from being transferred to the edge of the substrate W. As a result, a processing defect of a substrate due to contamination at the edge of the substrate W is prevented.

(13) Other Embodiments (13-1) While an example in which the three first support pins 722 and the three second support pins 732 are provided in the back surface cleaning unit SD1b is described in the embodiment described above, the invention is not limited to this. The four or five first support pins 722 may be provided in the back surface cleaning unit SD1b. Further, the four or five second support pins 732 may be provided in the back surface cleaning unit SD1b. In this case, the cleaning brush 760 preferably includes a number of bar-shaped brushes 761 that corresponds to a number of first support pins 722 and second support pins 732.

(13-2) While the entire back surface of the substrate is cleaned with the substrate W not being rotated by rotating the cleaning brush 760 in the back surface cleaning unit SD1b according to the embodiment described above, the invention is not limited to this. The three first support pins 722 and the three second support pins 732 may be configured to be rotatable around the vertical axis passing through the center of the circular opening 712. In this case, the three first support pins 722 and the three second support pins 732 are rotated instead of the cleaning brush 760 such that the substrate W can be moved relative to the cleaning brush 760. Thus, it is possible to clean the back surface of the substrate W by rotating the substrate W without rotating the cleaning brush 760.

(13-3) While the plurality of cleaning/drying processing units SD1a, the plurality of back surface cleaning units SD1b and the plurality of cleaning/drying processing units SD2 are provided in the interface block 14 in the substrate processing apparatus 100 according to the embodiment described above, the invention is not limited to this. Part or all of the plurality of cleaning/drying processing units SD1a, the plurality of back surface cleaning units SD1b and the plurality of cleaning/drying processing units SD2 may be provided in at least one of the first processing block 12 and the second processing block 13.

(13-4) While the substrate processing apparatus 100 according to the embodiment described above does not include an edge cleaning mechanism that cleans the edge of the substrate W, the invention is not limited to this. The substrate processing apparatus 100 may include the edge cleaning mechanism that cleans the edge of the substrate W. Further, the edge cleaning mechanism may have a cleaner (a cleaning brush, for example) that cleans the edge of the substrate W by coming into contact with the edge of the substrate W. In this case, in the substrate processing apparatus 100, a member for holding the substrate W or a member for supporting the substrate W does not come into contact with the edge of the substrate W after cleaning by the cleaner. Therefore, the edge of the substrate W is kept even cleaner.

(13-5) While the resist cover film is formed on the substrate W by the coating processing unit 129 in the coating processing chambers 32, 34 in the embodiment described above, the resist cover film does not have to be formed in the coating processing chambers 32, 34 when a water-resistant resist film is formed in the coating processing chambers 21, 23.

In that case, in the edge exposure unit EEW, condition of the resist film is inspected as surface condition.

When the resist cover film is not formed on the substrate W, the coating processing chambers 32, 34 do not have to be provided. Alternatively, another processing such as the resist film formation, the development processing or the like may be performed in the coating processing chambers 32, 34.

(13-6) While the controller 114 provided in the indexer block 11 controls each constituent element in the substrate processing apparatus 100 according to the embodiment described above, the invention is not limited to this. A block controller for controlling the operation of one or plurality of transport mechanisms and a plurality of units in the block may be provided for every block in the substrate processing apparatus 100. In this case, each of the plurality of transport mechanisms 115, 127, 128, 137, 138, 141, 142, 146, 420, the plurality of coating processing units 129, the plurality of development processing units 139, the plurality of thermal processing units PHP, the plurality of adhesion reinforcement processing units PAHP, the plurality of cooling units CP, the plurality of placement/cooling platforms P-CP and the plurality of edge exposure units EEW is controlled by the corresponding block controller.

(13-7) While the exposure device 15 that performs the exposure processing for the substrate W using the liquid immersion method is used as an external device of the substrate processing apparatus 100 in the embodiment described above, the invention is not limited to this. An exposure device that performs the exposure processing for the substrate W without using a liquid may be used as an external device of the substrate processing apparatus 100.

(13-8) While the substrate suction sheet 220 that holds the back surface of the substrate W by suction is used in the adhesion reinforcement processing units PAHP, the cooling units CP and the thermal processing units PHP as one example of the constituent elements that hold the substrate W in the embodiment described above, the invention is not limited to this. In the adhesion reinforcement processing units PAHP, the cooling units CP and the thermal processing units PHP, a plurality of projection members may be provided on the substrate placement plate 210 instead of the substrate suction sheet 220. In this case, the substrate W is supported by the plurality of projection members on the substrate placement plate 210 with the back surface of the substrate W is not being sucked.

(14) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the embodiment described above, the substrate W is an example of a substrate, the main surface of the substrate W is an example of one surface, the back surface of the substrate W is an example of the other surface, the substrate processing apparatus 100 is an example of a substrate processing apparatus, the coating liquid for the resist film and the development liquid are examples of a processing liquid, each of the coating processing units 129 and the development processing units 139 is an example of a processing liquid supply unit and each of the adhesion reinforcement processing units PAHP and the cooling units CP is an example of a first temperature processing unit.

Further, each of the hands H1, H2 of the transport mechanisms 127, 128, 137, 138 is an example of a first holder, each of the transport mechanisms 127, 128, 137, 138 is an example of a first transport device, the controller 114 is an example of a controller, each of the spin chucks 25, 35 are examples of a second holder and each of the nozzles 28 and the slit nozzles 38 are examples of a liquid supply mechanism.

Further, the substrate suction sheets 220 of the adhesion reinforcement processing units PAHP and the cooling units CP are examples of a third holder, the temperature processing device 250 is an example of a first temperature processing device, each of the suction portions sm of the hands H1 to H8, the spin chucks 25, 35 and the substrate suction sheets 220 is an example of a suction holding mechanism.

Further, the coating processing unit 129 is an example of one processing liquid supply unit, the development processing unit 139 is an example of another processing liquid supply unit, the first processing block 12 and the second processing block 13 are examples of a processing section, the indexer block 11 is an example of a carry-in/carry-out section, the interface block 14 is an example of an interface section, the exposure device 15 is an example of an exposure device, the back surface cleaning unit SD1*b* is an example of a cleaning unit, the plurality of first support pins 722, the plurality of second support pins 732 and the plurality of suction portions sm provided at the plurality of first support pins 722 and the plurality of second support pins 732 are examples of a fourth holder and the motor 750, the rotation shaft 751 and the cleaning brush 760 are examples of a cleaning mechanism.

Further, the contact portions on the back surface of the substrate W with the suction portions sm of the first support pin 722 indicated by the reference numerals p1 in FIGS. 27 to 30 are examples of a first portion, the contact portions on the back surface of the substrate W with the suction portions sm of the second support pin 732 indicated by the reference numerals p2 in FIGS. 30 to 33 are examples of a second portion, the plurality of first support pins 722 and the plurality of suction portions sm provided at the plurality of first support pins 722 are examples of a first suction holding mechanism and the plurality of second support pins 732 and the plurality of suction portions sm provided at the plurality of second support pins 732 are examples of a second suction holding mechanism.

Further, the air suction devices 740*a*, 740*b* are examples of a switch mechanism, the cleaning brush 760 is an example of a cleaner, the motor 750 and the rotation shaft 751 are examples of a cleaner moving mechanism, the transport mechanisms 141, 142, 146 are examples of a second transport device, the hands H3 to H8 are examples of a fifth holder and the thermal processing unit PHP is an example of a second temperature processing unit.

Further, the cooling section 400C is an example of a cooling section, the heating section 400H is an example of a heating section, the transport arm 430 and the plurality of substrate suction sheets 440 are examples of a sixth holder, the transport mechanism 420 is an example of a third transport device, the substrate placement plate 470 is an example of a cooling device, the substrate suction sheets 220 in the heating section 400H are examples of a seventh holder and the temperature processing device 250 in the heating section 400H is an example of a heating device.

As each of various elements recited in the claims, various other elements having configuration or functions described in the claims can be also used.

INDUSTRIAL APPLICABILITY

The present invention can be effectively utilized for processing for various types of substrates.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A substrate processing apparatus that performs predetermined processing on a substrate having one surface and the other surface, comprising:
   one or plurality of processing liquid supply units that supplies a processing liquid to the one surface of the substrate;
   a temperature processing unit that performs temperature processing on the substrate before the processing liquid is supplied or after the processing liquid is supplied by the one or plurality of processing liquid supply units;
   one or plurality of cleaning units that cleans the other surface of the substrate before the processing liquid is supplied or after the processing liquid is supplied by the one or plurality of processing liquid supply units;
   a first transport device, having a first holder that holds the other surface of the substrate without coming into contact with an edge of the substrate, configured to transport the substrate by moving the first holder; and
   a controller that is configured and operable to control the first transport device such that the substrate is transported among any one of the one or plurality of processing liquid supply units, the temperature processing unit, and any one of the one or plurality of cleaning units, wherein
   each of the one or plurality of processing liquid supply units includes:
   a second holder that holds the other surface of the substrate without coming into contact with the edge of the substrate, and
   a liquid supply mechanism that supplies a coating liquid for a photosensitive film or a development liquid to the one surface of the substrate held by the second holder as the processing liquid;

the temperature processing unit includes:
a third holder that holds the other surface of the substrate without coming into contact with the edge of the substrate, and
a temperature processing device that performs the temperature processing on the substrate held by the third holder;
each of the one or plurality of cleaning units includes:
a fourth holder that holds the other surface of the substrate without coming into contact with the edge of the substrate, and
a cleaning mechanism that cleans the other surface of the substrate held by the fourth holder;
the fourth holder includes:
a first suction holding mechanism that sucks a first portion on the other surface of the substrate, and
a second suction holding mechanism that sucks a second portion different from the first portion on the other surface of the substrate; and
the cleaning mechanism includes:
a cleaner configured such that it can come into contact with the other surface of the substrate, and
a cleaner moving mechanism that brings the cleaner into contact with the other surface of the substrate and moves the cleaner relative to the substrate held by the first or second suction holding mechanism, and
the cleaner moving mechanism is configured to clean a region except for the first portion on the other surface of the substrate by the cleaner while the substrate is held by the first suction holding mechanism and the substrate is not held by the second suction holding mechanism, and is configured to clean a region except for the second portion on the other surface of the substrate by the cleaner while the substrate is held by the second suction holding mechanism and the substrate is not held by the first suction holding mechanism, and wherein
the first portion is positioned on a line extending in a first radial direction of the substrate except for a center of the substrate,
the second portion is positioned on a line extending in a second radial direction that is different from the first radial direction of the substrate except for the center of the substrate,
the cleaner is configured to extend in a radial direction of the substrate and to be capable of coming into contact with the other surface of the substrate from the center to an outer peripheral edge on the other surface of the substrate at a time, and
the cleaner moving mechanism is configured to bring the cleaner into contact with the other surface of the substrate and to be capable of cleaning the other surface of the substrate by rotating the cleaner relative to the substrate held by the first or second suction holding mechanism around an axis passing through the center of the substrate.

2. The substrate processing apparatus according to claim 1, wherein
each of the first holder, the second holder and the third holder has a suction holding mechanism that sucks the other surface of the substrate.

3. The substrate processing apparatus according to claim 1, wherein the one or plurality of processing liquid supply units includes the plurality of processing liquid supply units,
a liquid supply mechanism of one processing liquid supply unit of the plurality of processing liquid supply units is configured to supply the coating liquid for the photosensitive film to the one surface of the substrate, and
a liquid supply mechanism of another processing liquid supply unit of the plurality of processing liquid supply units is configured to supply the development liquid to the one surface of the substrate.

4. The substrate processing apparatus according to claim 3, comprising:
a processing section that includes the plurality of processing liquid supply units, the temperature processing unit and the first transport device;
a carry-in/carry-out section, provided to be adjacent to one end of the processing section, configured to carry in and carry out the substrate to/from the processing section; and
an interface section, arranged between the other end of the processing section and an exposure device that performs exposure processing on the substrate, configured to receive and transfer the substrate between the processing section and the exposure device,
wherein the one or plurality of cleaning units are included in at least one of the processing section and the interface section.

5. The substrate processing apparatus according to claim 1, wherein
each of the one or plurality of cleaning units further includes
a switch mechanism that switches the first suction holding mechanism between a suction state in which the first portion is sucked and a released state in which suction of the first portion is released, and switches the second suction holding mechanism between a suction state in which the second portion is sucked and a released state in which suction of the second portion is released.

6. The substrate processing apparatus according to claim 1, wherein
each of the one or plurality of cleaning units is configured to clean the other surface of the substrate before the exposure processing by an exposure device.

7. The substrate processing apparatus according to claim 4, wherein
the interface section includes a second transport device, having a fifth holder that holds the other surface of the substrate without coming into contact with the edge of the substrate, configured to transport the substrate by moving the fifth holder, and
the controller controls the second transport device such that the substrate is transported between the processing section and the exposure device.

8. The substrate processing apparatus according to claim 7, wherein
the fifth holder has a suction holding mechanism that sucks the other surface of the substrate.

9. The substrate processing apparatus according to claim 1, wherein the cleaner is a brush.

* * * * *